US008653585B2

(12) United States Patent
Youm et al.

(10) Patent No.: US 8,653,585 B2
(45) Date of Patent: Feb. 18, 2014

(54) NONVOLATILE MEMORY DEVICE INCLUDING A CHANNEL PAD HAVING A CHANNEL EXTENDING PORTION AND A SPACER AND METHOD OF MANUFACTURING THE SAME

(75) Inventors: Eun-sun Youm, Seongnam-si (KR); Sang-yong Park, Suwon-si (KR); Jin-taek Park, Hwaseong-si (KR); Yong-top Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/404,047

(22) Filed: Feb. 24, 2012

(65) Prior Publication Data
US 2012/0228697 A1 Sep. 13, 2012

(30) Foreign Application Priority Data
Mar. 9, 2011 (KR) .................... 10-2011-0021042

(51) Int. Cl.
*H01L 29/66* (2006.01)
(52) U.S. Cl.
USPC .............. 257/329; 257/E29.262; 257/314; 257/E29.309; 257/E27.103

(58) Field of Classification Search
USPC .......... 257/324, 329, 314, E29.262, E27.103, 257/E29.309
See application file for complete search history.

(56) References Cited

U.S. PATENT DOCUMENTS

| 8,363,476 B2 * | 1/2013 | Lue et al. ................. 365/185.18 |
| 2009/0179257 A1 | 7/2009 | Komori et al. |
| 2010/0019310 A1 * | 1/2010 | Sakamoto ..................... 257/324 |
| 2010/0109065 A1 * | 5/2010 | Oh et al. ......................... 257/314 |
| 2010/0148237 A1 | 6/2010 | Kito et al. |
| 2010/0155810 A1 | 6/2010 | Kim et al. |
| 2011/0147824 A1 * | 6/2011 | Son et al. ........................ 257/324 |
| 2012/0070944 A1 * | 3/2012 | Kim et al. ....................... 438/128 |

FOREIGN PATENT DOCUMENTS

| JP | 2009-164433 A | 7/2009 |
| JP | 2010-147125 A | 7/2010 |
| KR | 10-2010-0075098 A | 7/2010 |

* cited by examiner

*Primary Examiner* — Bilkis Jahan
(74) *Attorney, Agent, or Firm* — Lee & Morse, P.C.

(57) ABSTRACT

A nonvolatile memory device having a vertical structure and a method of manufacturing the same, the nonvolatile memory device including a channel region that vertically extends from a substrate; gate electrodes on the substrate, the gate electrodes being disposed along an outer side wall of the channel region and spaced apart from one another; and a channel pad that extends from one side of the channel region to an outside of the channel region, the channel pad covering a top surface of the channel region.

12 Claims, 21 Drawing Sheets

NONVOLATILE MEMORY DEVICE INCLUDING A CHANNEL PAD HAVING A CHANNEL EXTENDING PORTION AND A SPACER AND METHOD OF MANUFACTURING THE SAME

CROSS-REFERENCE TO RELATED APPLICATIONS

Korean Patent Application No. 10-2011-0021042, filed on Mar. 9, 2011, in the Korean Intellectual Property Office, and entitled: "Nonvolatile Memory Device and Method of Manufacturing the Same," is incorporated by reference herein in its entirety.

BACKGROUND

1. Field

Embodiments relate to a nonvolatile memory device and a method of manufacturing the same.

2. Description of the Related Art

Sizes of electronic products should be minimized and the devices should process more data. Accordingly, it may be necessary to increase a degree of integration of semiconductor memory devices used in such electronic products. In order to increase the degree of integration of semiconductor memory devices, nonvolatile memory devices having a vertical transistor structure, instead of a planar transistor structure, have been considered.

SUMMARY

Embodiments are directed to a nonvolatile memory device and a method of manufacturing the same.

The embodiments may be realized by providing a nonvolatile memory device having a vertical structure, the nonvolatile memory device including a channel region that vertically extends from a substrate; gate electrodes on the substrate, the gate electrodes being disposed along an outer side wall of the channel region and spaced apart from one another; and a channel pad that extends from one side of the channel region to an outside of the channel region, the channel pad covering a top surface of the channel region.

The channel pad may include a channel extending portion vertically extending on the channel region, and a spacer on an outer circumferential surface of the channel extending portion.

The nonvolatile memory device may further include a buried insulating layer at a center of the channel region, wherein the channel pad further includes a conductive layer on a top surface of the buried insulating layer, the conductive layer filling in the channel extending portion.

A distance between the substrate and a bottom surface of the conductive layer may be less than a distance between the substrate and a bottom surface of the spacer.

The spacer may form a bent portion at a boundary with an outer side wall of the channel extending portion or the channel region.

An area of a top surface of the channel pad may be greater than an area of the top surface of the channel region.

The nonvolatile memory device may further include a bit line contact plug on the channel pad, the bit line contact plug being connected to a bit line.

The nonvolatile memory device may further include an insulating spacer on a side surface of the channel pad.

The channel pad may include a channel extending portion vertically extending on the channel region, and a cover portion on the channel extending portion, the cover portion having an area greater than an area of the channel extending portion.

The embodiments may also be realized by providing a method of manufacturing a nonvolatile memory device having a vertical structure, the method including alternately stacking interlayer sacrificial layers and interlayer insulating layers on a substrate; forming first openings that pass through the interlayer sacrificial layers and the interlayer insulating layers and exposing the substrate; forming a channel region over each of the first openings; and forming a channel pad that extends from the first opening to an outside of the channel region to cover a top surface of the channel region.

Forming the channel pad may include forming a channel extending portion on the channel region at an upper part of each of the first openings, forming a conductive layer in each of the first openings such that the conductive layer is connected to the channel extending portion; removing portions of the interlayer insulating layers at a side surface of the channel extending portion to a predetermined height to expose the side surface of the channel extending portion; and forming a conductive spacer on the side surface of the channel extending portion.

A first distance between the substrate and a bottom surface of the conductive layer may be less than a second distance between the substrate and a bottom surface of the conductive spacer.

The method may further include forming a buried insulating layer on the channel region to fill each of the first openings after forming the channel region, wherein the conductive layer is formed on a top surface of the buried insulating layer.

The method may further include forming an insulating spacer on a side surface of the channel pad after forming the channel pad.

Forming the channel pad may include depositing a conductive material on a top surface of the channel region; and patterning the conductive material by photolithography.

The embodiments may also be realized by providing a nonvolatile memory device having a vertical structure, the nonvolatile memory device including a channel region that vertically extends from a substrate; gate electrodes on the substrate, the gate electrodes being disposed along an outer side wall of the channel region and spaced apart from one another; and a conductive channel pad on and electrically connected to the channel region, wherein the channel pad covers a top surface of the channel region, and an area of a top surface of the channel pad is greater than an area of a top surface of the channel region.

The channel pad may include a conductive channel extending portion overlying the channel region, a conductive layer encompassed by the channel extending portion, and a conductive spacer on an outer circumferential surface of the channel extending portion.

The nonvolatile memory device may further include an insulating spacer on an outer circumferential surface of the channel pad.

The channel pad may include a conductive channel extending portion overlying the channel region, a conductive layer encompassed by the channel extending portion, and a conductive cover portion overlying the channel extending portion and the conductive layer, an area of a top surface of the cover portion being greater than an area of top surfaces of the channel extending portion and the conductive layer.

The nonvolatile memory device may further include a bit line contact plug on and electrically connected to the channel pad, the bit line contact plug being electrically connected to a bit line.

BRIEF DESCRIPTION OF THE DRAWINGS

The embodiments will become apparent to those of ordinary skill in the art by describing in detail exemplary embodiments with reference to the attached drawings, in which.

DETAILED DESCRIPTION

Figure 1:
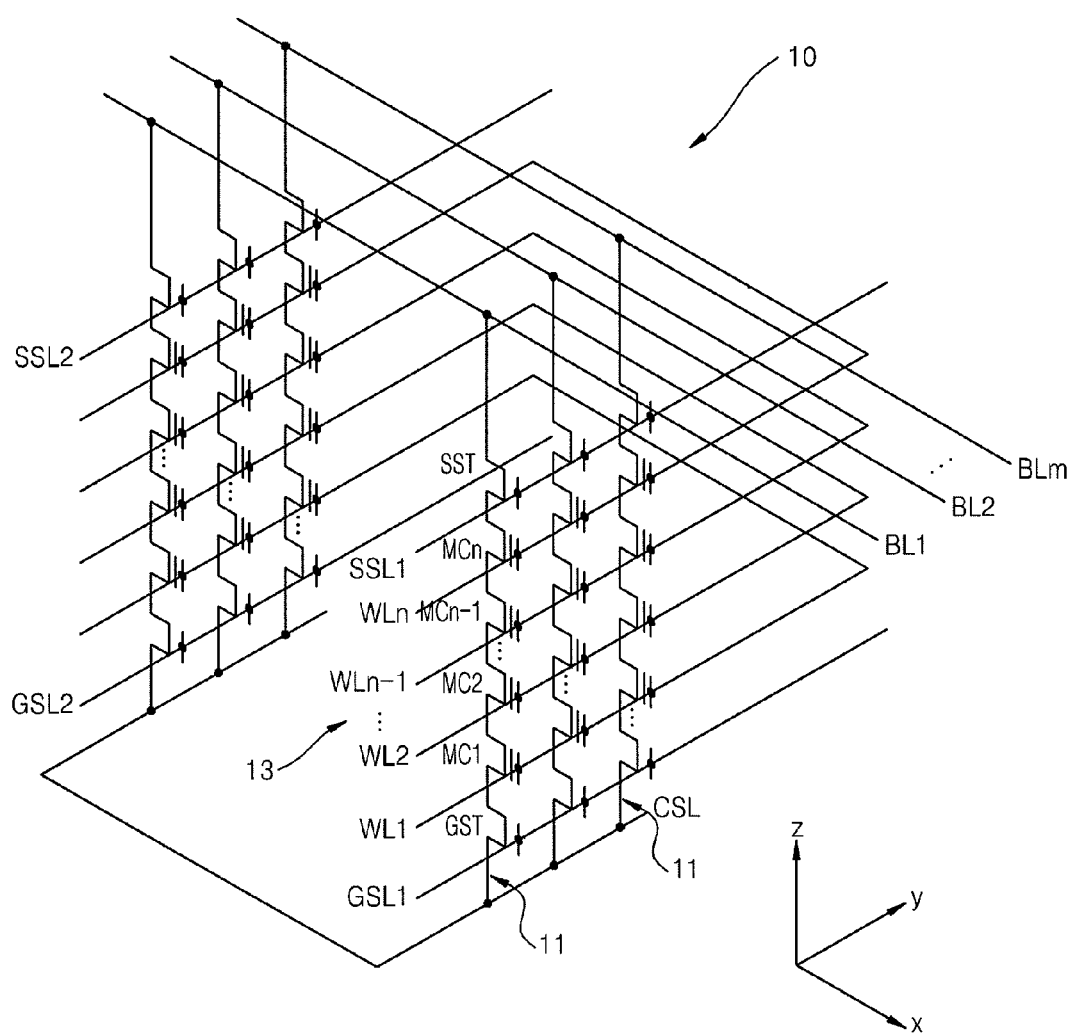
FIG. 1 illustrates an equivalent circuit of a memory cell array of a nonvolatile memory device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. Like reference numerals denote like elements. Furthermore, various elements and regions illustrated in the drawings are schematic in nature and their shapes may not be intended to illustrate the actual shapes of the elements or the regions and may not be intended to limit the scope of the exemplary embodiments.

FIG. 1 illustrates an equivalent circuit of a memory cell array 10 of a nonvolatile memory device according to an embodiment. In FIG. 1, an equivalent circuit of a NAND flash memory device having a vertical channel structure is illustrated.

Referring to FIG. 1, the memory cell array 10 may include a plurality of memory cell strings 11. Each of the memory cell strings 11 may have a vertical structure that extends in a vertical direction (i.e., a z-direction) perpendicular to directions (i.e., an x-direction and a y-direction) in which a main surface of a substrate (not shown) extends. The plurality of memory cell strings 11 may constitute a memory cell block 13.

Each of the memory cell strings 11 may include a plurality of memory cells MC1 through MCn, a string selection transistor SST, and a ground selection transistor GST. In each of the memory cell strings 11, the ground selection transistor GST, the plurality of memory cells MC1 through MCn, and the string selection transistor SST may be arranged in series in the vertical direction (i.e., the z-direction). The plurality of memory cells MC1 through MCn may store data. A plurality of word lines WL1 through WLn may be respectively connected to the memory cells MC1 through MCn to control the memory cells MC1 through MCn. The number of memory cells MC1 through MCn may be appropriately determined according to a desired capacity of the nonvolatile memory device.

A plurality of bit lines BL1 through BLm (extending in the x-direction) may be connected to one end of respective memory cell strings 11 arranged in first through mth columns of the memory cell block 13, e.g., drains of the string selection transistors SST. Also, a common source line CSL may be connected to another end of respective memory cell strings 11, e.g., sources of the ground selection transistors GST.

The word lines WL1 through WLn (extending in the y-direction) may be commonly connected to gates of respective memory cells MC1 through MCn. Data of the plurality of memory cells MC1 through MCn may be programmed, read, or erased according to operations of the word lines WL1 through WLn.

In the memory cell strings 11, the string selection transistors SST may be disposed between the bit lines BL1 through BLm and the memory cells MC1 through MCn. In the memory cell block 13, the string selection transistors SST may control data transfer between the plurality of bit lines BL1 through BLm and the plurality of memory cells MC1 through MCn using string selection lines SSL connected to gates of the string selection transistors SST.

The ground selection transistors GST may be disposed between the plurality of memory cells MC1 through MCn and the common source line CSL. In the memory cell block 13, the ground selection transistors GST may control data transfer between the plurality of memory cells MC1 through MCn and the common source line CSL due to ground selection lines GSL being connected to gates of the ground selection transistors GST.

Figure 2:
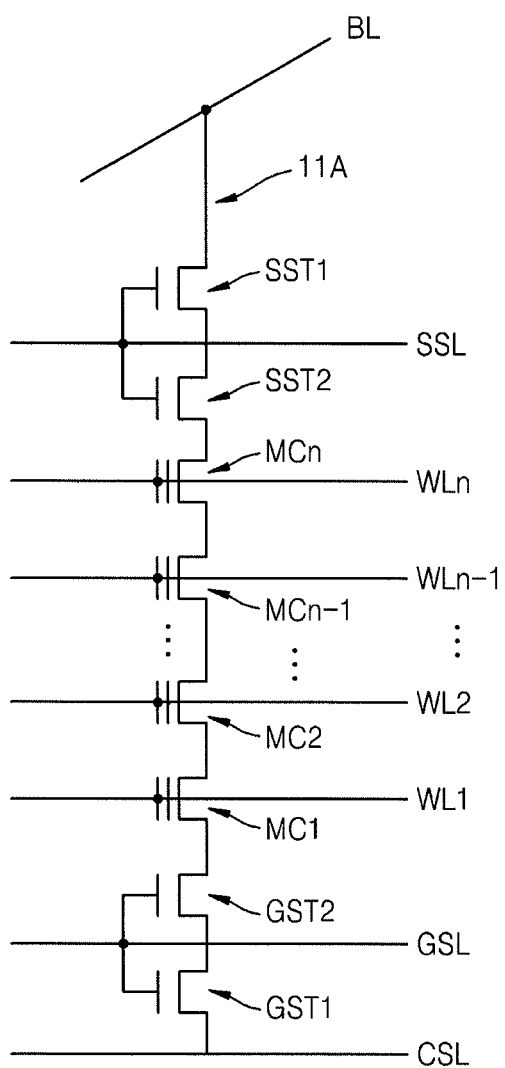
FIG. 2 illustrates an equivalent circuit of a memory cell string of a nonvolatile memory device according to another embodiment.

FIG. 2 illustrates an equivalent circuit of a memory cell string of a nonvolatile memory device according to another embodiment. In FIG. 2, an equivalent circuit of one memory cell string 11A included in a NAND flash memory device having a vertical channel structure is illustrated.

In FIG. 2, the same elements as those in FIG. 1 are denoted by the same reference numerals, and a repeated detailed explanation thereof is omitted.

While the string selection transistor SST may be a single transistor in FIG. 1, a pair of string selection transistors SST1 and SST2, instead of the string selection transistor SST of FIG. 1, may be arranged in series between a bit line BL and the memory cells MC1 through MCn in FIG. 2. In this case, a string selection line SSL may be commonly connected to gates of the string selection transistors SST1 and SST2. The string selection line SSL may correspond to a first string selection line SSL1 or a second string selection line SSL2 of FIG. 1.

Also, while the ground selection transistor GST is a single transistor in FIG. 1, a pair of ground selection transistor GST1 and GST2, instead of the ground selection transistor GST, may be arranged in series between the plurality of memory cells MC1 through MCn and the common source line CSL in FIG. 2. In this case, the ground selection line GSL may be commonly connected to gates of the ground selection transistors GST1 and GST2. The ground selection line GSL may correspond to a first ground selection line GSL1 or a second ground selection line GSL2 of FIG. 1.

The bit line BL may correspond to any one of the bit lines BL1 through BLm of FIG. 1.

Figure 3:
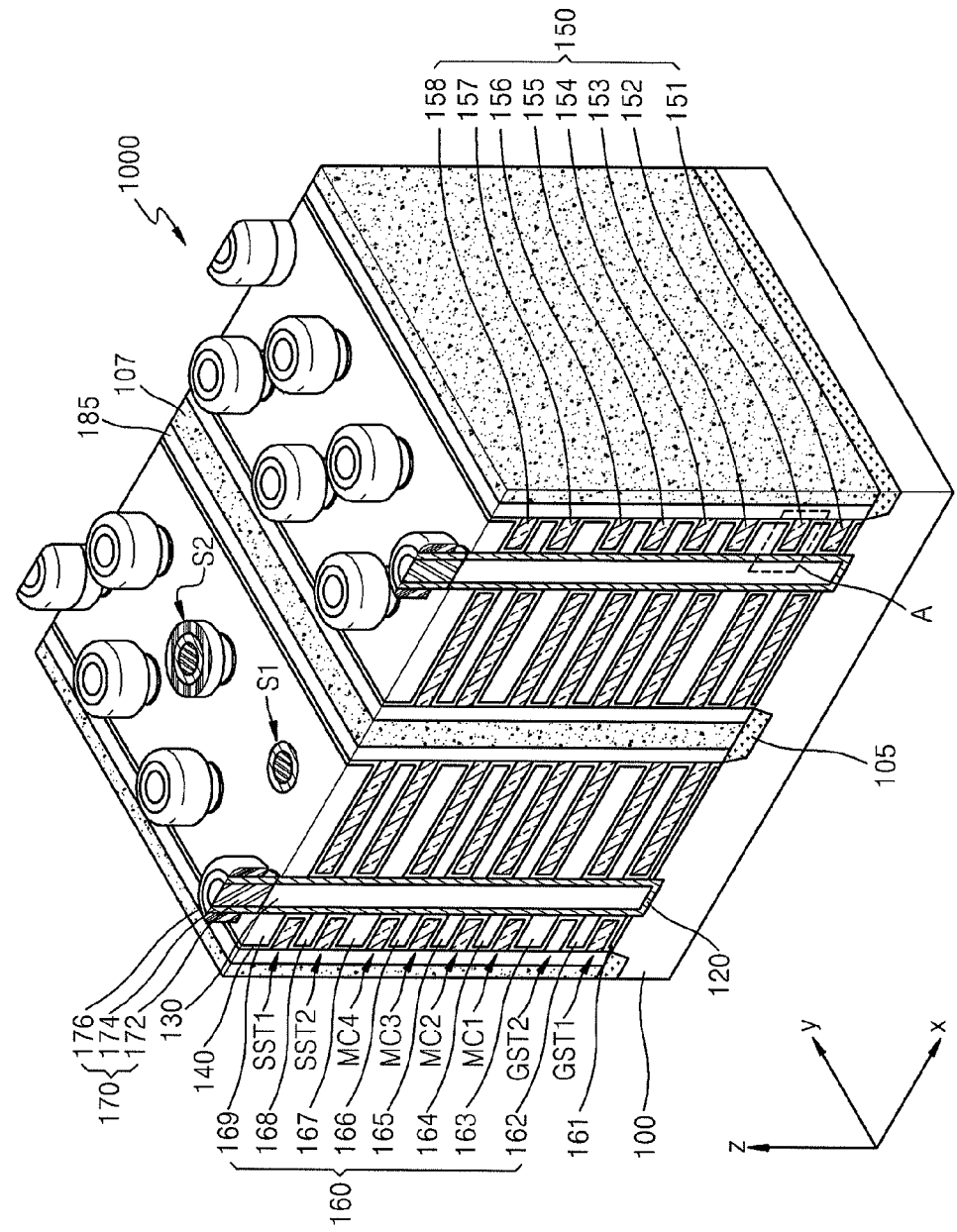
FIG. 3 illustrates a perspective view of a three-dimensional (3D) structure of memory cell strings of a nonvolatile memory device according to an embodiment.

FIG. 3 illustrates a perspective view of a three-dimensional (3D) structure of memory cell strings of a nonvolatile memory device 1000 according to an embodiment.

In FIG. 3, some elements constituting the memory cell string 11 of FIG. 1 may not be shown. For example, the bit lines BL2 through BLm of the memory cell string 11 are not shown.

Referring to FIG. 3, the nonvolatile memory device 1000 may include channel regions 120 on a substrate 100 and a plurality of memory cell strings along side walls of the channel regions 120. The plurality of memory cell strings may extend in the y-direction along side surfaces of the channel regions 120 (that are arranged in the y-direction). As shown in FIG. 3, the memory cell strings 11 or 11A (see FIGS. 1 and 2) extending in a z-direction from the substrate 100 may be arranged along the side surfaces of the channel regions 120. Each of the memory cell strings 11 or 11A may include two ground selection transistors GST1 and GST2, a plurality of memory cells MC1, MC2, MC3, and MC4, and two string selection transistors SST1 and SST2.

The substrate 100 may have a main surface that extends in a plane of the x-direction and the y-direction. The substrate 100 may include a semiconductor material, e.g., a group IV semiconductor, a group III-V compound semiconductor, or a group II-VI oxide semiconductor. For example, the group IV semiconductor may include silicon, germanium, or silicon-germanium. In an implementation, the substrate 100 may be a bulk wafer or an epitaxial layer.

The channel regions 120 (each having a pillar shape) may be disposed on the substrate 100 to extend in the z-direction. The channel regions 120 may be disposed apart from one another in the x- and y-directions in a zigzag fashion along the y-direction. For example, the plurality of channel regions 120 adjacent to one another in the y-direction may be offset in the x-direction. Also, although the channel regions 120 are offset in 2 columns in FIG. 3, the embodiments are not limited thereto, and the channel regions 120 may be disposed in a zigzag fashion to be offset in 3 or more columns. The channel regions 120 may be formed to have annular shapes. Bottom surfaces of the channel regions 120 may directly contact the substrate 100 and thus, the channel regions 120 may be electrically connected to the substrate 100. The channel regions 120 may include a semiconductor material, e.g., polysilicon or single crystal silicon, and the semiconductor material may be undoped, or may include, e.g., p-type or n-type impurities. A buried insulating layer 130 may be formed in each of the channel regions 120. Although the channel regions 120 adjacent to each other with a common source line 107 therebetween are illustrated as being symmetric to each other about the common source line 107 in FIG. 3, the embodiments are not limited thereto.

A channel pad 170 may cover a top surface of the buried insulating layer 130 and may be electrically connected to respective ones of the channel regions 120. The channel pad 170 may include a conductive layer 172 (on the top surface of the buried insulating layer 130), a channel extending portion 174 (on or overlying the channel region 120 or formed when the channel region 120 extends around the conductive layer 172), and a spacer 176 (disposed around the channel extending portion 174). In an implementation, the channel extending portion 174 and the conductive layer 172 may be integrally formed. The conductive layer 172 may be encompassed by the channel extending portion 174. The channel extending portion may be formed of a conductive material. A distance between the substrate 100 and a bottom surface of the spacer 176 may be greater than a distance between the substrate 100 and a bottom surface of the conductive layer 172. However, relative lengths of the conductive layer 172 and the spacer 176 are not limited thereto, and may change in various ways.

A bit line contact plug (not shown) may be connected to the channel pad 170. The channel pad 170 may act as drain regions of the string selection transistors SST1 and SST2. Due to the spacer 176, an area of a region to which the bit line contact plug is connected may be a second area S2, which may be greater than an area S1, as illustrated in FIG. 3.

The channel pad 170 may include a conductive material, e.g., polysilicon and/or a metal. The conductive layer 172, the channel extending portion 174, and the spacer 176 may include the same material or different materials. In an implementation, only the conductive layer 172 and the channel extending portion 174 may be formed of the same material.

A plurality of the first string selection transistors SST1 arranged in the x-direction may be commonly connected to the bit lines BL (see FIG. 2) via the channel pads 170. The bit lines BL may extend in a linear pattern in the x-direction, and the first string selection transistors SST1 may be electrically connected to the bit line contact plugs formed on the channel pads 170. Also, a plurality of the first ground selection transistors GST1 arranged in the x-direction may be electrically connected to impurity regions 105 adjacent to the first ground selection transistors GST1.

The impurity regions 105 may be arranged adjacent to the main surface of the substrate 100 to extend in the y-direction and to be spaced apart from one another in the x-direction. One impurity region 105 may be disposed between two channel regions 120 in the x-direction. The impurity regions 105 may be source regions, and may form a PN junction with others regions of the substrate 100. The impurity regions 105 may include high density impurity regions (not shown) that are disposed adjacent to the main surface of the substrate 100 and located at a center of the impurity region 105, and low density impurity regions (not shown) that are disposed at sides of the high density impurity regions.

The common source line 107 may be disposed on each of the impurity regions 105 to extend in the z-direction and to be in ohmic contact with the impurity region 105. The common source line 107 may provide source regions to the ground selection transistors GST1 and GST2 of memory cell strings of side surfaces of two channel regions 120 that are adjacent to each other in the x-direction. The common source line 107 may extend in the y-direction along the impurity region 105. The common source line 107 may include a conductive material. For example, the common source line 107 may include at least one metal material selected from tungsten (W), aluminum (Al), and copper (Cu). Although not shown in FIG. 3, a silicide layer may be interposed between the impurity region 105 and the common source line 107 in order to reduce contact resistance. The silicide layer (not shown) may include a metal silicide layer, e.g., a cobalt silicide layer. Insulating regions 185 having spacer shapes may be formed on side surfaces of the common source line 107.

A plurality of gate electrodes 151 through 158 (which are collectively referred to as gate electrodes 150) may be arranged along the side surface of the channel region 120 and spaced apart from the substrate 100 in the z-direction. The gate electrodes 150 may be gates of the ground selection transistors GST1 and GST2, the plurality of memory cells MC1, MC2, MC3, and MC4, and the string selection transistors SST1 and SST2. The gate electrodes 150 may be commonly connected to adjacent memory cell strings arranged in the y-direction. The gate electrodes 157 and 158 of the string selection transistors SST1 and SST2 may be connected to the string selection line SSL (see FIG. 1). The gate electrodes 153, 154, 155, and 156 of the memory cells MC1, MC2, MC3, and MC4 may be connected to the word lines WL, WL2, WLn-1, and WLn (see FIGS. 1 and 2), respectively. The gate electrodes 151 and 152 of the ground selection transistors GST1 and GST2 may be connected to the ground selection line GSL (see FIG. 1). The gate electrodes 150 may include a metal film, e.g., a tungsten (W) film. Also, although not shown in FIG. 3, the gate electrodes 150 may further include a diffusion barrier film. For example, the diffusion barrier film may include any one selected from the group of tungsten nitride (WN), tantalum nitride (TaN), and titanium nitride (TiN).

A gate dielectric film 140 may be disposed between the channel region 120 and the gate electrodes 150. Although not shown in detail in FIG. 3, the gate dielectric film 140 may include a tunneling insulating layer, a charge storage layer, and a blocking insulating layer (which are sequentially stacked from the channel region 120).

The tunneling insulating layer may tunnel charges to the charge storage layer by using F-N tunneling. The tunneling insulating layer may include, e.g., a silicon oxide. The charge storage layer may be a charge trap layer or a floating gate conductive film. For example, the charge storage layer may include quantum dots or nanocrystals. In an implementation, the quantum dots or the nanocrystals may include conductors, e.g., metal or semiconductor particles. The blocking insulating layer may include a high-k dielectric material. In an implementation, the high-k dielectric material may refer to a dielectric material having a dielectric constant higher than that of an oxide film, e.g., a silicon oxide film.

A plurality of interlayer insulating layers 161 through 169 (which are collectively referred to as interlayer insulating layers 160) may be arranged between the gate electrodes 150. The interlayer insulating layers 160 may be spaced apart from one another in the z-direction and may extend in the y-direction, like the gate electrodes 150. One side surface of the interlayer insulating layers 160 may contact the channel regions 120. The interlayer insulating layers 160 may include, e.g., silicon oxide or silicon nitride.

Although four memory cells MC1, MC2, MC3, and MC4 are arranged in FIG. 3, the embodiments are not limited thereto, and more or fewer memory cells may be arranged according to a desired capacity of the semiconductor memory device 1000. Also, two string selection transistors SST1 and SST2 and two ground selection transistors GST1 and GST2 of the memory cell strings may be arranged. Gate lengths of the (selection) gate electrodes 151, 152, 157, and 158 when the number string selection transistors SST and ground selection transistors GST is at least two may be much lower than gate lengths of the (selection) gate electrodes 151, 152, 157, and 158 when the number of string selection transistors SST and ground selection transistors GST is one, thereby facilitating filling between the interlayer insulating layers 160 without voids. However, the embodiments are not limited thereto, and a memory cell string may include only one string selection transistor SST and one ground selection transistor GST as shown in FIG. 1. Also, the string selection transistor SST and the ground selection transistor GST may have structures different from those of the memory cells MC1, MC2, MC3, and MC4.

In the nonvolatile memory device 1000 having a vertical structure of FIG. 3, an area of, e.g., an upper surface of, the channel pad 170 (to which a bit line contact plug for connecting the channel region 120 and a bit line is connected) may be greater than an area of the channel region 120. For example, the area of the channel pad 170 (to which a bit line contact plug for connecting the channel region 120 and a bit line is connected) may be greater than a sectional area of the channel region 120. Accordingly, although a size of the channel region 120 may decrease as the nonvolatile memory device 1000 is minimized, the bit line contact plug may be stably formed.

Figure 4A:
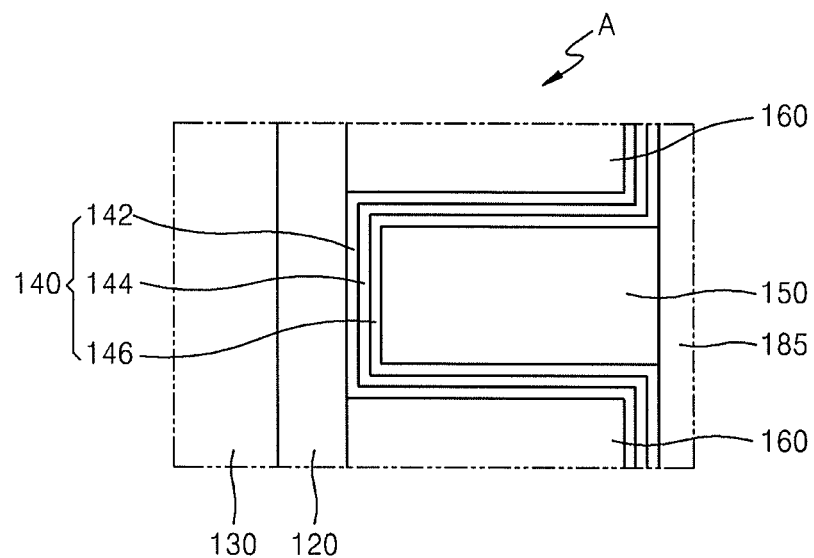
FIG. 4A illustrates an enlarged cross-sectional view of a gate dielectric film of the structure of FIG. 3 according to an embodiment.
Figure 4B:
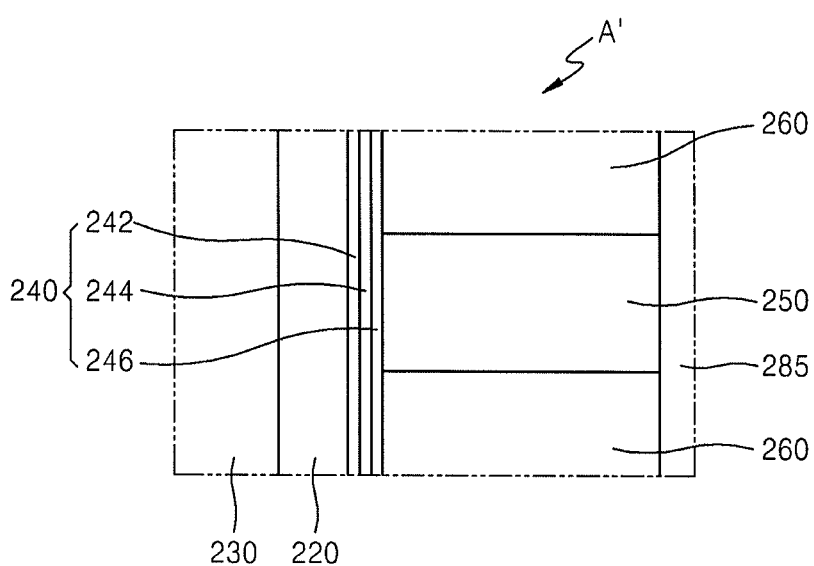
FIG. 4B illustrates an enlarged view of the gate dielectric film of the structure of FIG. 3 according to another embodiment.

FIG. 4A illustrates an enlarged cross-sectional view of a portion A of FIG. 3, showing the gate dielectric film 140 according to an embodiment. FIG. 4B illustrates an enlarged view showing the gate dielectric film 140 according to another embodiment.

Referring to FIG. 4A, the channel region 120 may be used as a channel of a memory cell string. The buried insulating layer 130 may be disposed on one side, e.g., a left side, of the channel region 120. The gate dielectric film 140 may be disposed on another side, e.g., a right side, of the channel region 120. Also, the interlayer insulating layers 160 may contact one, e.g., a right, side wall of the channel region 120 and may be disposed over and under the gate dielectric film 140. The gate dielectric film 140 may be disposed to cover one, e.g., a right, side surface of an upper interlayer insulating layer 160, to surround the gate electrodes 150, and to cover one, e.g., a right, side surface of a lower interlayer insulating layer 160, thereby forming one surface. The insulating region 185 may be located on sides, e.g., right sides, of the gate electrodes 150 and the gate dielectric film 140.

The gate dielectric film 140 may include a tunneling insulating layer 142, a charge storage layer 144, and a blocking insulating layer 146, which may be sequentially stacked from one, e.g., a right, side wall of the channel region 120.

The tunneling insulating layer 142 may be a single layer or a multi-layer structure including at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 144 may be a charge trap layer or a floating gate conductive film. If the charge storage layer 142 is a floating gate conductive film, the charge storage layer 144 may be formed by depositing polysilicon by using chemical vapor deposition (CVD), e.g., low pressure CVD (LPCVD) using $SiH_4$ gas or $Si_2H_6$ and $PH_3$ gas. If the charge storage layer 144 is a charge trap layer, the charge storage layer 144 may include at least one of silicon oxide ($SiO_2$), silicon nitride ($Si_3N_4$), silicon oxynitride (SiON), hafnium oxide (HfO$_2$), zirconium oxide (ZrO$_2$), tantalum oxide (Ta$_2$O$_3$), titanium oxide (TiO$_2$), hafnium aluminum oxide (HfAl$_x$O$_y$), hafnium tantalum oxide (HfTa$_x$O$_y$), hafnium silicon oxide (HfSi$_x$O$_y$), aluminum nitride (Al$_x$N$_y$), and aluminum gallium nitride (AlGa$_x$N$_y$).

The blocking insulating layer 146 may include at least one of silicon oxide (SiO$_2$), silicon nitride (Si$_3$N$_4$), silicon oxynitride (SiON), and a high-k dielectric layer. The blocking insulating layer 146 may be formed of a material having a dielectric constant higher than that of the tunneling insulating layer 142. The high-k dielectric layer may include at least one of aluminum oxide (Al$_2$O$_3$), tantalum oxide (Ta$_2$O$_3$), titanium oxide (TiO$_2$), yttrium oxide (Y$_2$O$_3$), zirconium oxide (ZrO$_2$), zirconium silicon oxide (ZrSi$_x$O$_y$), hafnium oxide (HfO$_2$), hafnium silicon oxide (HfSi$_x$O$_y$), lanthanum oxide (La$_2$O$_3$), lanthanum aluminum oxide (LaAl$_x$O$_y$), lanthanum hafnium oxide (LaHf$_x$O$_y$), hafnium aluminum oxide (HfAl$_x$O$_y$), and praseodymium oxide (Pr$_2$O$_3$).

Referring to FIG. 4B, a buried insulating layer 230 may be disposed on one, e.g., a left, side of the channel region 220. A gate dielectric film 240 may cover an entire, e.g., right, side surface of a channel region 220. Also, a gate electrode 250 may be disposed on one, e.g., a right, side of the gate dielectric film 240. Interlayer insulating layers 260 may be disposed over and under the gate electrode 250, and an insulating region 285 may be disposed on one, e.g., a right, side of the gate electrode 250.

The gate dielectric film 240 may include a tunneling insulating layer 242, a charge storage layer 244, and a blocking insulating layer 246, which may be sequentially stacked from one, e.g., a right, side wall of the channel region 220. The tunneling insulating layer 242, the charge storage layer 244, and the blocking insulating layer 246 may be substantially the same as the tunneling insulating layer 142, the charge storage layer 144, and the blocking insulating layer 146 of FIG. 4A, respectively.

Figure 5A:
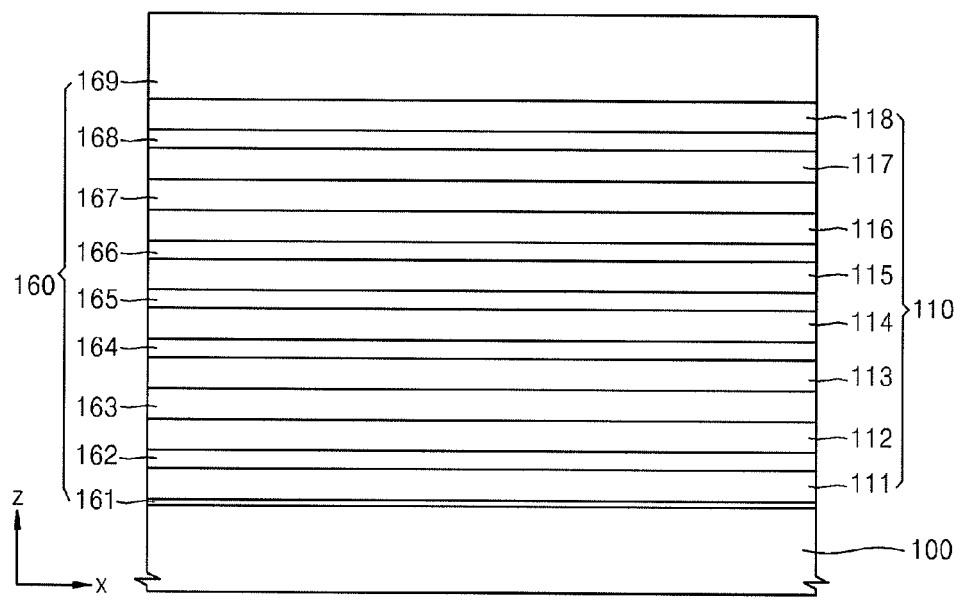
FIGS. 5A through 5N illustrate cross-sectional views of stages in a method of manufacturing the nonvolatile memory device of FIG. 3.
Figure 5B:
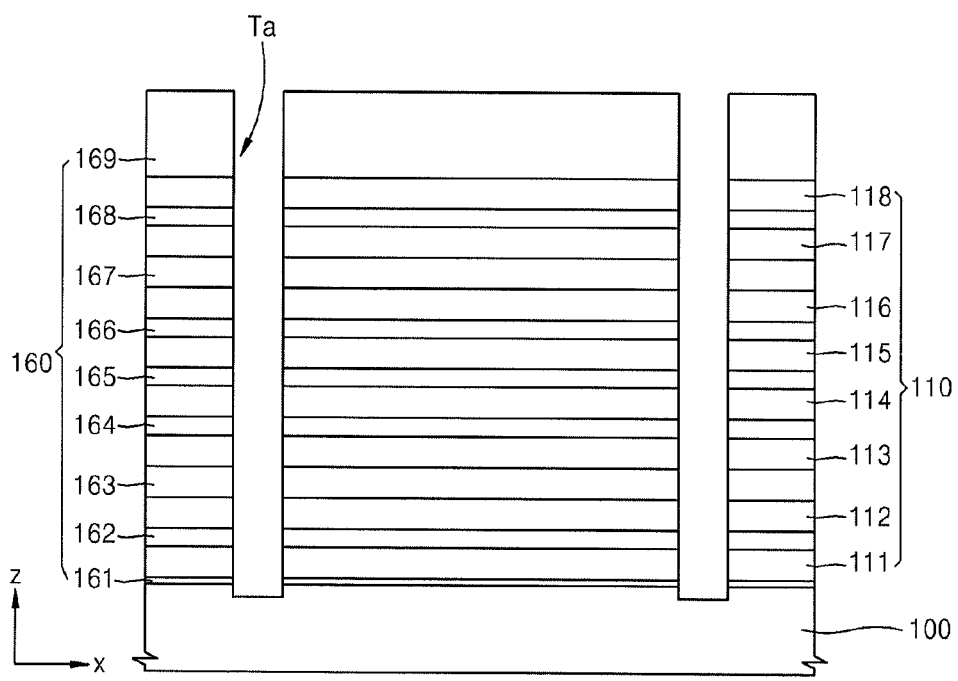
Figure 5C:
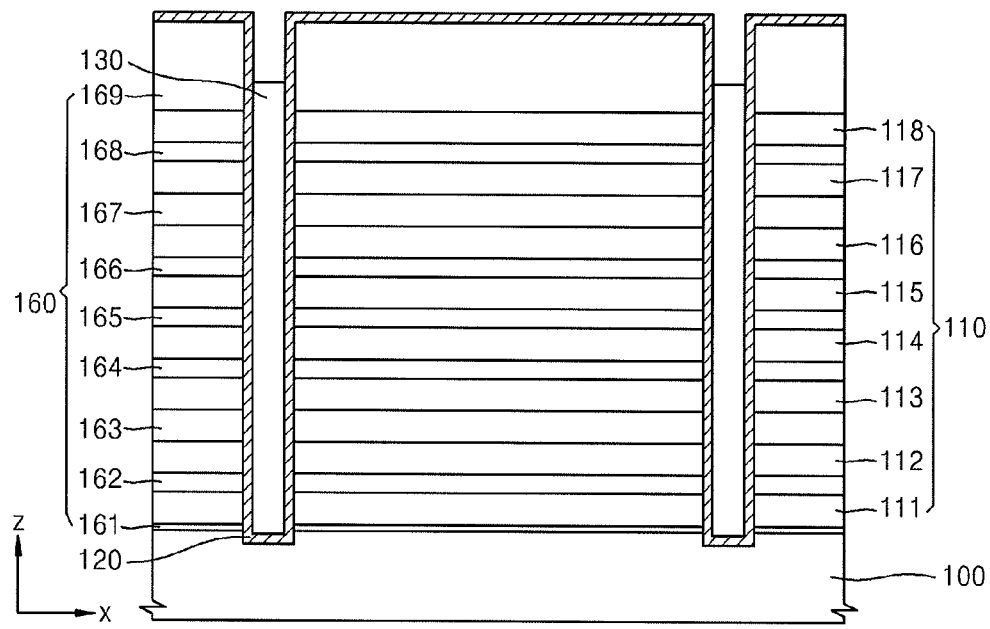
Figure 5D:
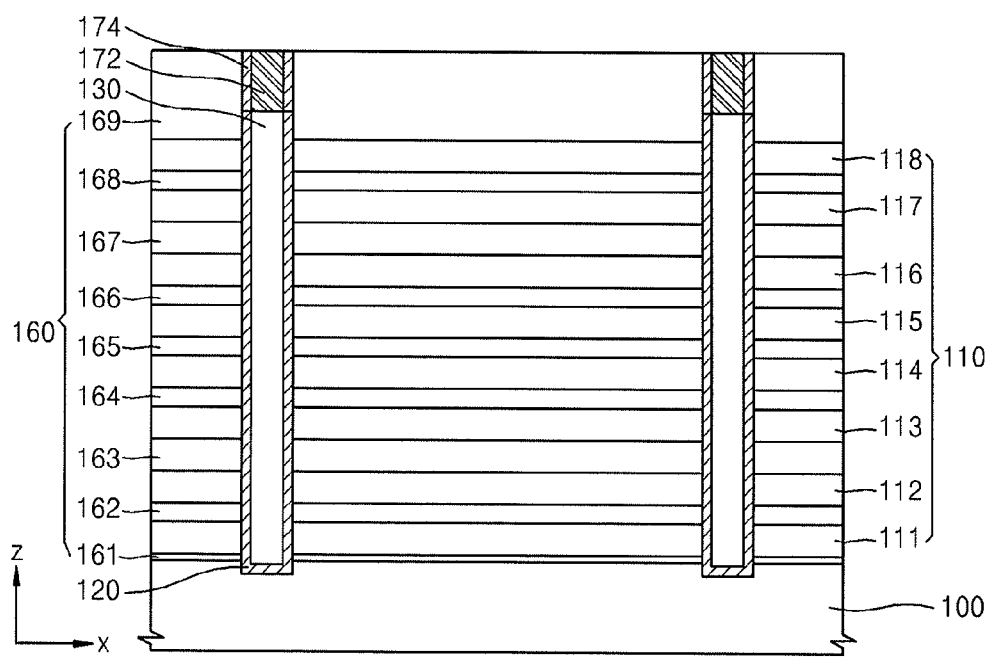
Figure 5E:
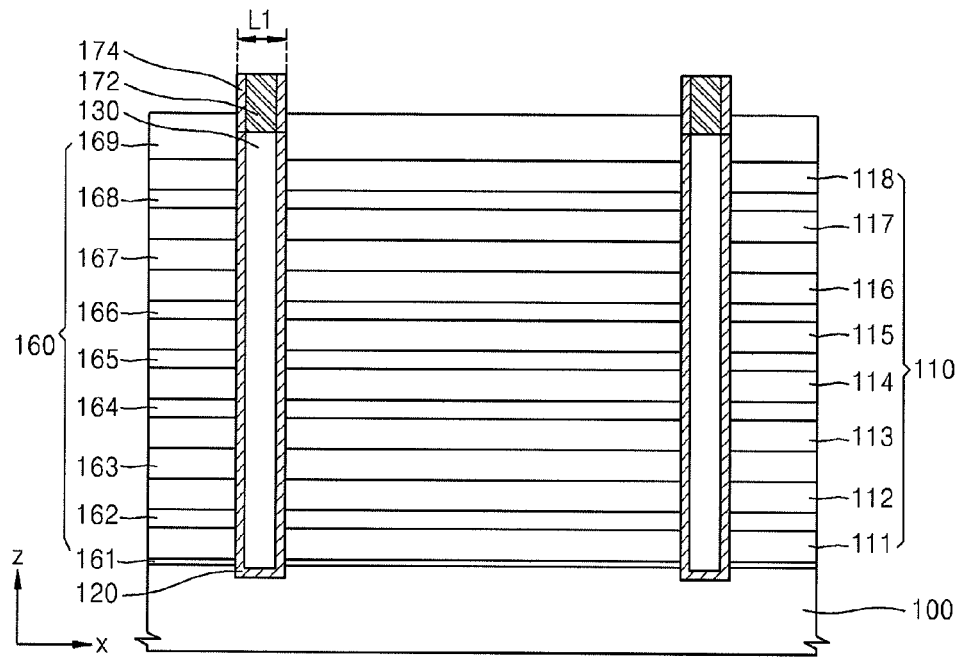
Figure 5F:
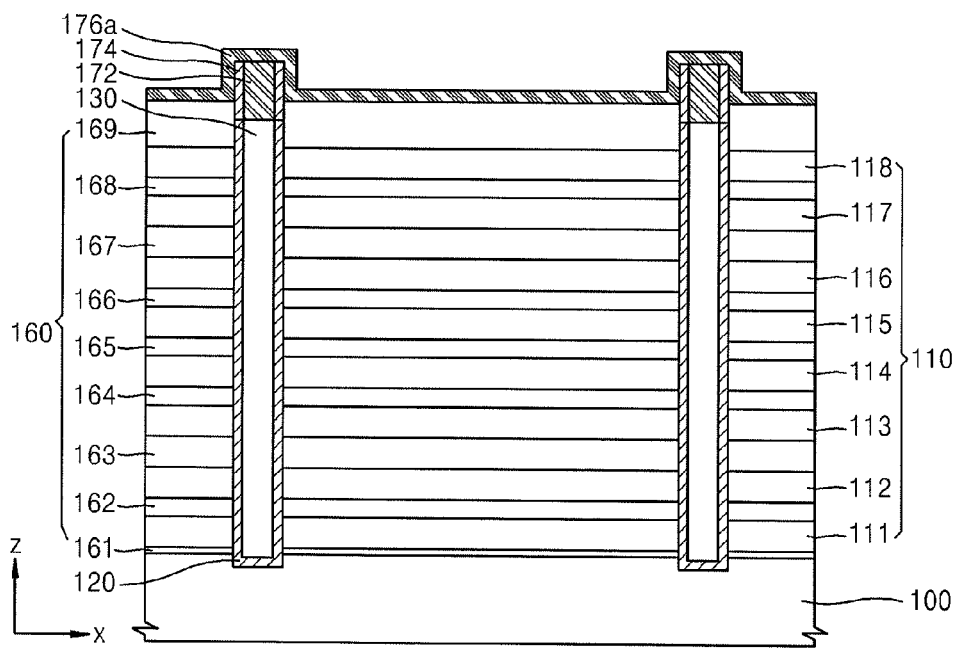
Figure 5G:
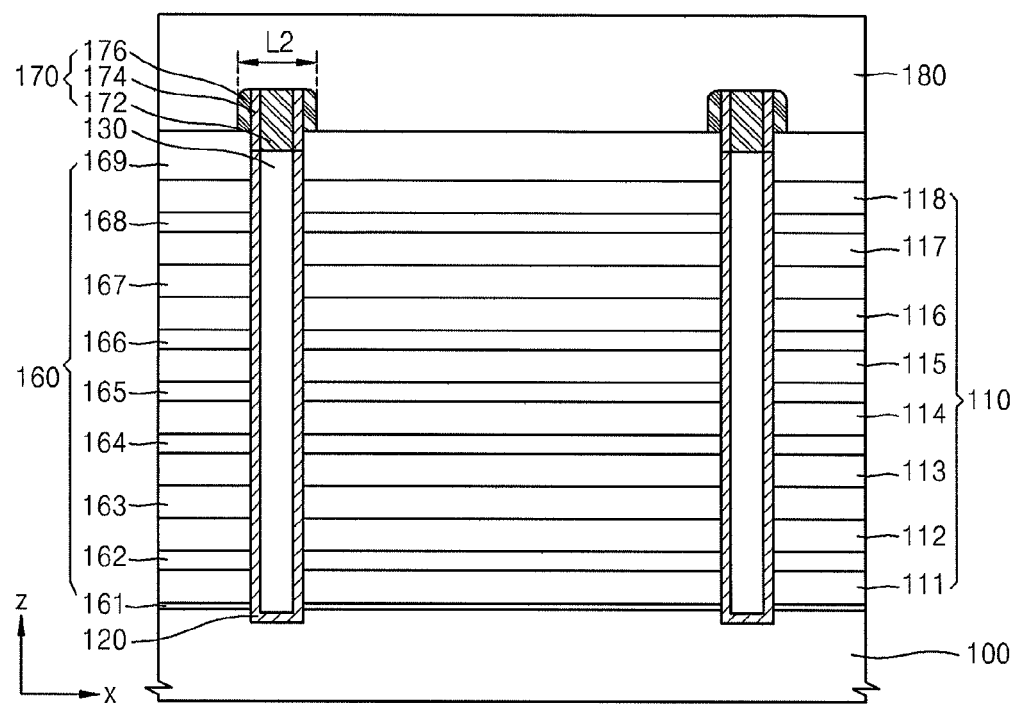
Figure 5H:
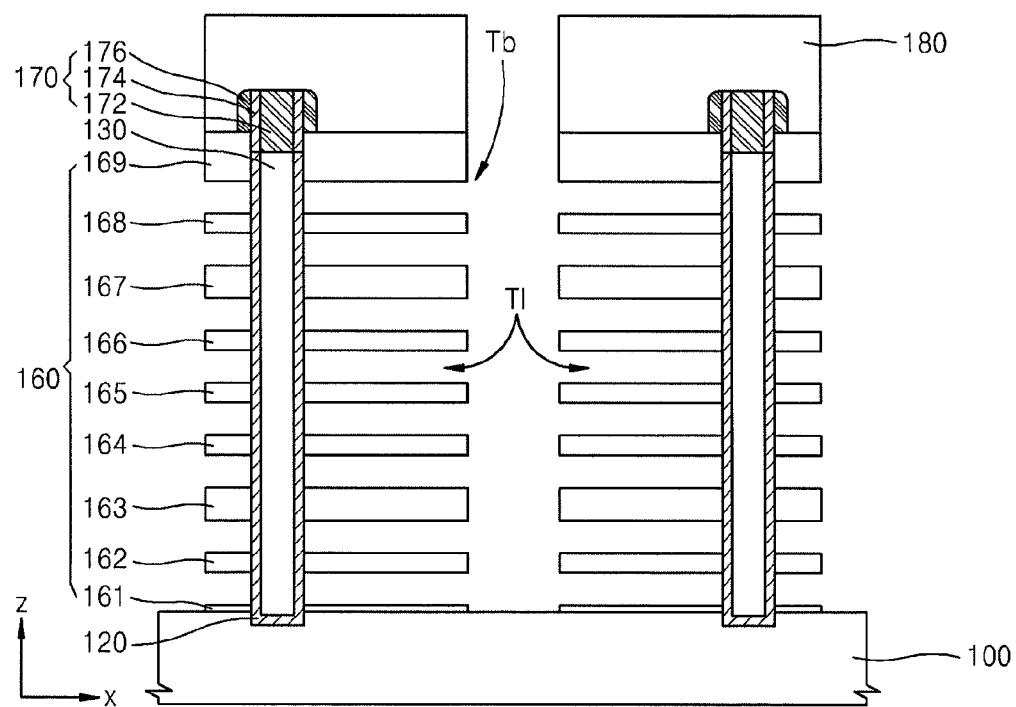
Figure 5I:
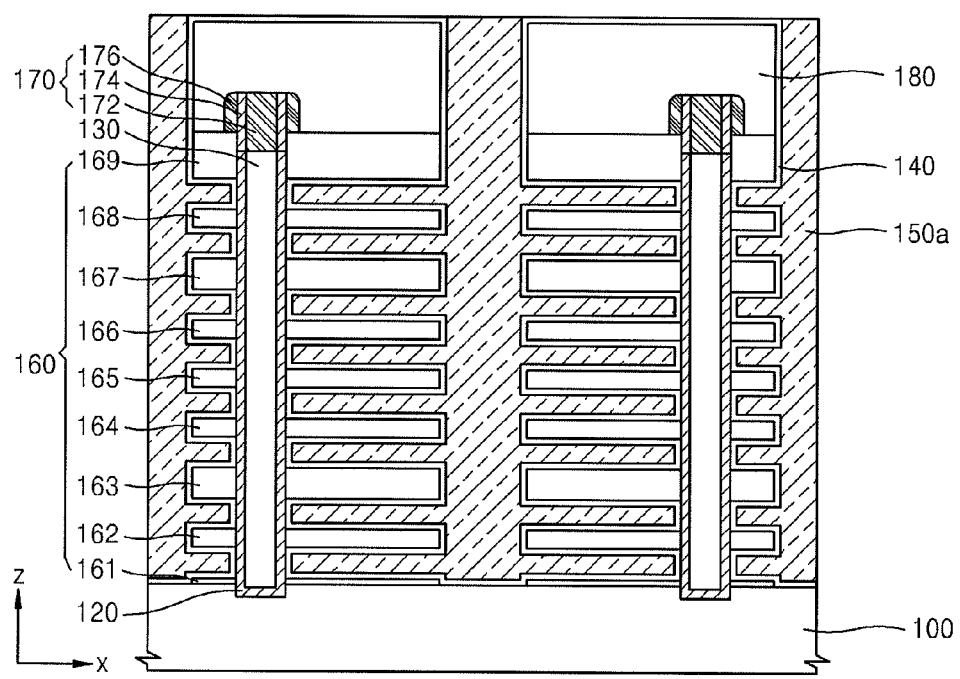
Figure 5J:
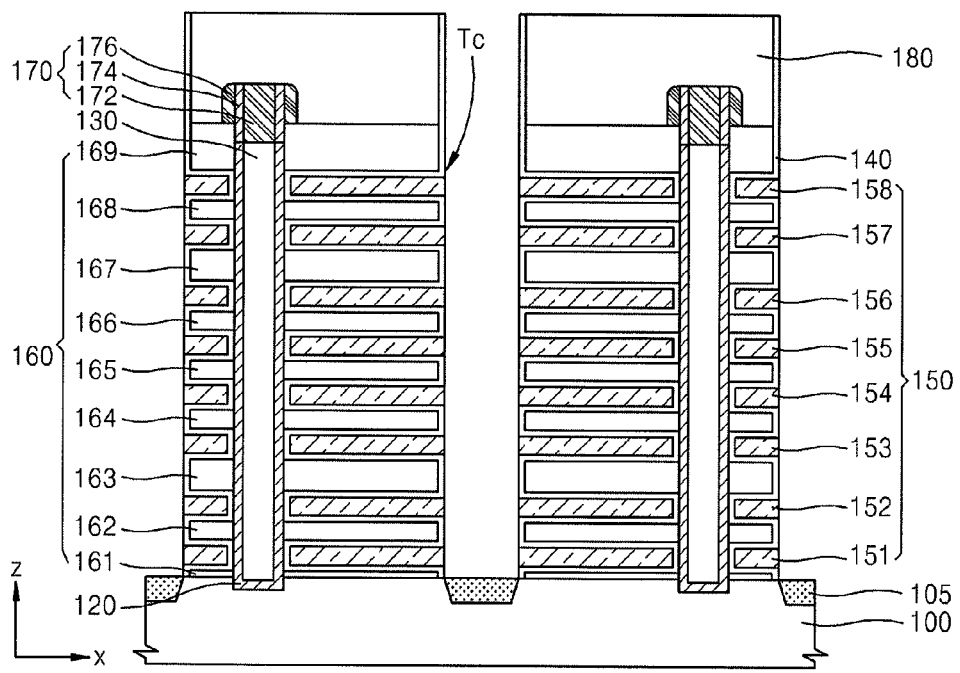
Figure 5K:
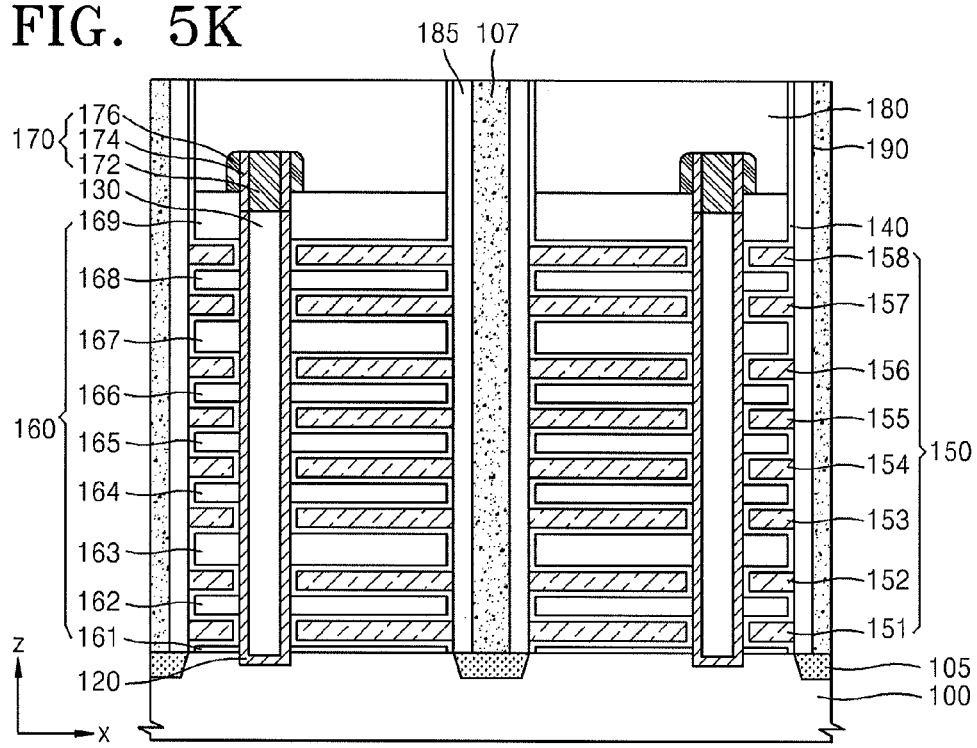
Figure 5L:
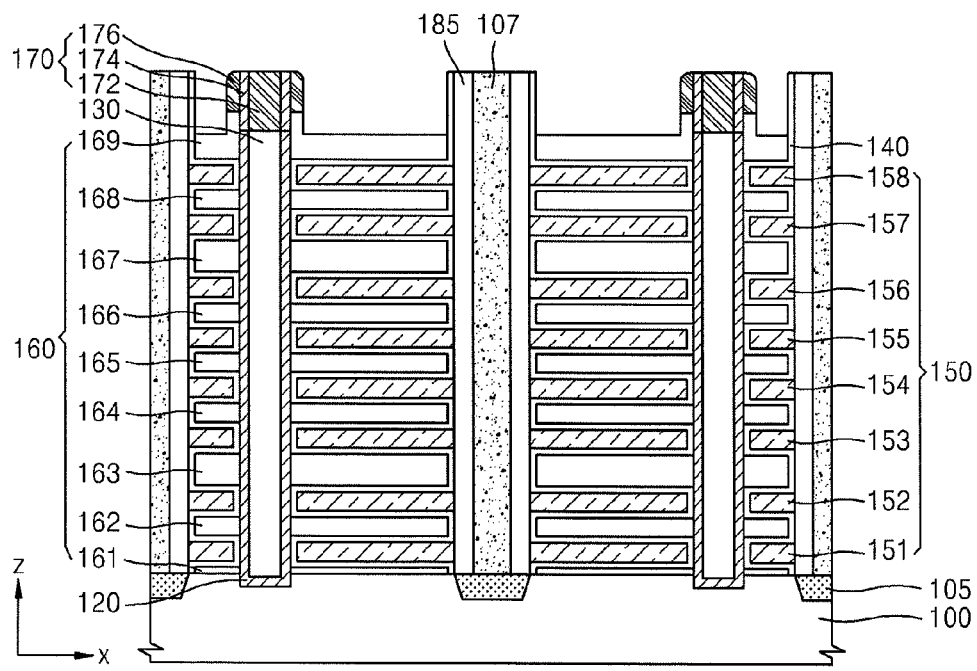
Figure 5M:
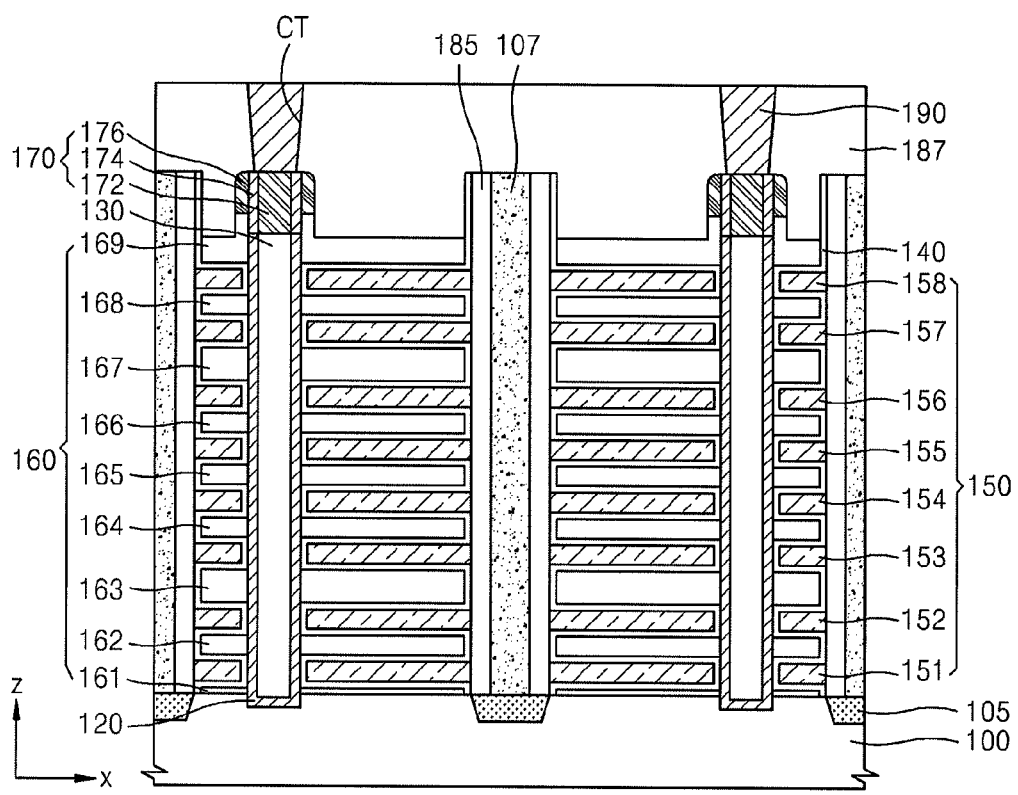
Figure 5N:
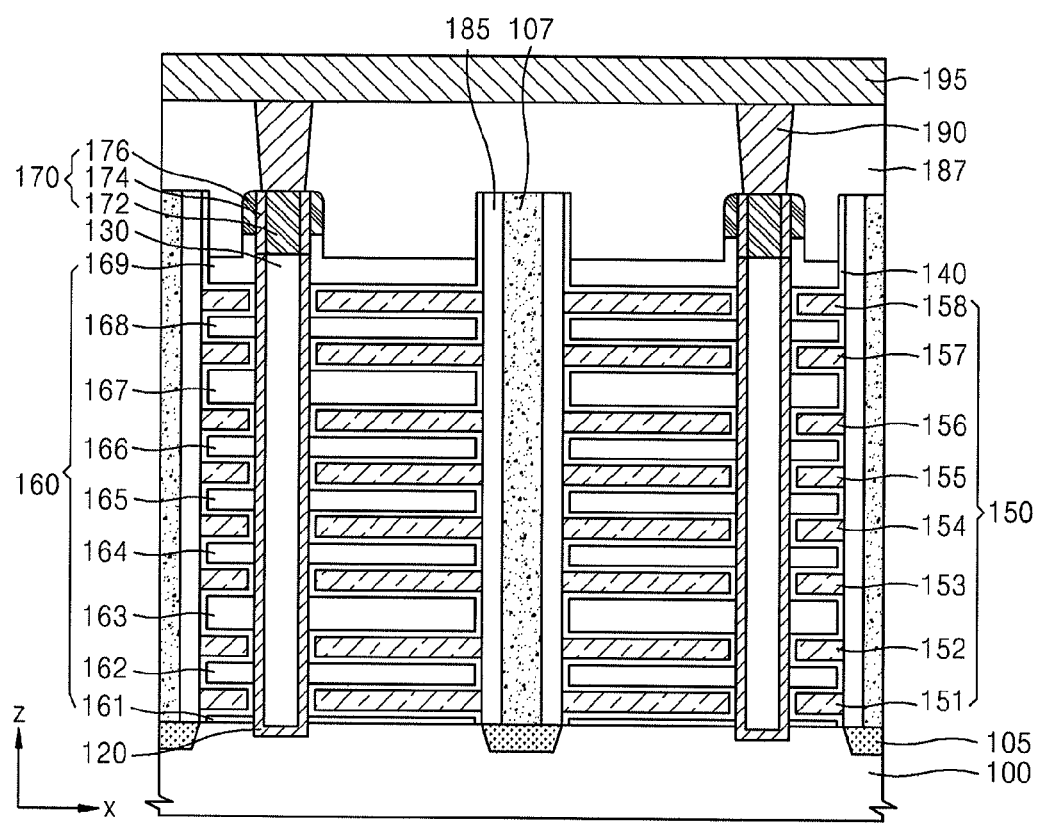

FIGS. 5A through 5N illustrate cross-sectional views showing stages in a method of manufacturing the nonvolatile memory device of FIG. 3, when seen in the y-direction.

Referring to FIG. 5A, interlayer sacrificial layers 111 through 118 (which are collectively referred to as interlayer sacrificial layers 110) and the plurality of interlayer insulating layers 161 through 169 (which are collectively referred to as the interlayer insulating layers 160) may be alternately stacked on the substrate 100. The interlayer sacrificial layers 110 and the interlayer insulating layers 160 may be alternately stacked on the substrate 100 starting with or from the interlayer insulating layer 161. The interlayer sacrificial layers 110 may be formed of a material having an etch selectivity with respect to the interlayer insulating layers 160. For example, the interlayer sacrificial layers 110 may be formed of a material that allows the interlayer sacrificial layers 110 to be etched while minimizing etching of the interlayer insulating layers 160. An etch selectivity may refer to a ratio of a rate at which the interlayer insulating layers 160 are etched to a rate at which the interlayer sacrificial layers 110 are etched. For example, the interlayer insulating layers 160 may be formed of at least one of a silicon oxide film and a silicon nitride film, and the interlayer sacrificial layers 110 may be formed of a film selected from the group of a silicon film, a silicon oxide film, a silicon carbide film, and a silicon nitride film, which is different from that of the interlayer insulating films 160.

According to the present embodiment, as shown in FIG. 5A, thicknesses of the interlayer insulating layers 160 may not be the same. The interlayer insulating layer 161 (that is a lowermost layer of the interlayer insulating layers 160) may have a relatively small thickness. The interlayer insulating layer 169 (that is an uppermost layer of the interlayer insulating layers 160) may have a relatively large thickness. However, thicknesses of the interlayer insulating layers 160 and the interlayer sacrificial layers 110 may differ, and the number of layers constituting each of the interlayer insulating layers 160 and the interlayer sacrificial layers 110 may also vary.

Referring to FIG. 5B, first openings Ta may be formed through the alternately stacked interlayer insulating layers 160 and the interlayer sacrificial layers 110. The first openings Ta may be holes having a depth in the z-direction. Also, adjacent first openings Ta may be isolated and may be spaced apart in the x-direction and the y-direction (see FIG. 3).

The first openings Ta may be formed by forming a predetermined mask pattern (not shown) that defines locations of the first openings Ta in the alternately stacked interlayer insulating layers 160 and the interlayer sacrificial layers 110, and anisotropically etching the interlayer insulating layers 160 and the interlayer sacrificial layers 110 by using the predetermined mask pattern as an etching mask. Although not shown in FIG. 5B, a structure including different types of films may be etched. Thus, inner walls of the plurality of first openings Ta may not be perpendicular relative to a top surface of the substrate 100. For example, widths of the first openings Ta may decrease toward the top surface of the substrate 100.

The first openings Ta may expose the top surface of the substrate 100 as shown in FIG. 5B. In addition, in the anisotropic etching process, portions of the substrate 100 under the first openings Ta may be recessed to a predetermined depth, as shown in FIG. 5B, due to, e.g., a result of over-etching.

Referring to FIG. 5C, the channel regions 120 may be formed to uniformly cover inner walls and bottom surfaces of the first openings Ta. The channel regions 120 may be formed to a predetermined thickness, e.g., a thickness of about 1/50 to about 1/5 of a width of a first opening Ta, by using atomic layer deposition (ALD) or CVD. The channel regions 120 may directly contact the substrate 100 at a bottom of the first openings Ta and may be electrically connected to the substrate 100.

Next, each of the first openings Ta may be filled with the buried insulating layer 130. The buried insulating layer 130 may be filled not to reach a top surface of the interlayer insulating layer 169, but rather to reach a predetermined height of the interlayer insulating layer 169. For example, after a material of the buried insulating layer 130 is deposited, an etch-back process may be additionally performed.

In an implementation, before the buried insulating layer 130 is formed, a hydrogen annealing process (for annealing a structure on which the channel regions 120 are formed in a gas atmosphere including, e.g., hydrogen or heavy hydrogen) may be further performed. Defects in the channel regions 120 may be removed using the hydrogen annealing process.

Referring to FIG. 5D, a material used to form the conductive layer 172 may be deposited on the buried insulating layer 130. After the material is deposited, portions of a material of the channel region 120 and a material of the conductive layer 172 (which are unnecessary and cover the interlayer insulating layer 169) may be removed by performing a planarization process. Accordingly, the conductive layer 172 may be formed on the buried insulating layer 130. For convenience of explanation, a portion of the channel region 120 disposed around the conductive layer 172 or a structure or material on the channel region may be referred to as the channel extending portion 174. Accordingly, the channel region 120 and the channel extending portion 174 may be formed of the same material. In an implementation, the channel extending portion 174 may be integrally formed with the conductive layer 172.

Referring to FIG. 5E, a process for removing a part of the interlayer insulating layer 169 may be performed such that the conductive layer 172 and the channel extending portion 174 partially protrude over the interlayer insulating layer 169. In a cross-sectional view taken along a center, the conductive layer 172 and the channel extending portion 174 may have a first length L1 in a lateral direction. For example, the first length L1 may correspond to a diameter of a circle including the conductive layer 172 at its center and surrounded by the channel extending portion 174.

Referring to FIG. 5F, a spacer material 176a may be formed on the conductive layer 172, the channel extending portion 174, and the interlayer insulating layer 169. The spacer material 176a may be a conductive material. The spacer material 176a may include the same material as that of the conductive layer 172 and/or the channel extending portion 174.

Referring to FIG. 5G, the spacer 176 may be formed by partially removing the spacer material 176a. The spacer material 176a may be removed by, e.g., anisotropic etching. Accordingly, the spacer 176 may be formed on the channel extending portion 174 to surround the channel extending portion 174. The channel pad 170, including the conductive layer 172, the channel extending portion 174, and the spacer 176, may thus be completely formed. In an implementation, a bent portion may be formed between a bottom surface of the spacer 176 and the channel region 120 or the channel extending portion 174. After the channel pad 170 is formed, an upper insulating layer 180 may be formed on the interlayer insulating layer 169 and the channel pad 170.

The channel pad 170 may have a second length L2 in a lateral direction. The second length L2 may correspond to a diameter of a circle including the conductive layer 172 and the channel extending portion 174 at its center and surrounded by the spacer 176. The second length L2 may be greater than the first length L1 (described with reference to FIG. 5E), and a landing margin of a bit line contact plug to be formed in a subsequent process may be secured. Also, a decrease of uniformity in contact resistance between memory cell strings and an increase in contact resistance (which may occur when the bit line contact plug is downwardly longitudinally formed along a side surface of the channel region 120 due to misalignment) may be reduced and/or prevented.

Referring to FIG. 5H, a second opening Tb (through which the substrate 100 is exposed) may be formed. The second opening Tb may extend in the y-direction (see FIG. 3). According to the present embodiment, as shown in FIG. 5H, one second opening Tb may be formed between the channel regions 120. However, the embodiments are not limited thereto, and relative positions of the channel regions 120 and the second opening Tb may differ.

The second opening Tb may be formed by anisotropically etching the upper insulating layer 180, the interlayer insulating layers 160, and the interlayer sacrificial layers 110 (see FIG. 5H). The second opening Tb may correspond to a region where the common source line 107 is to be formed (extending in a y-direction) in a subsequent process. The interlayer sacrificial layers 110 (exposed through the second opening Tb) may be removed by an etching process, and thus, a plurality of side openings T1 defined between the interlayer insulating layers 160 may be formed. Side walls of the channel regions 120 may be partially exposed through the side openings T1.

Referring to FIG. 5I, the gate dielectric film 140 may be formed to uniformly cover the channel regions 120, the interlayer insulating layers 160, and the substrate 100 exposed through the second opening Tb and the side openings T1.

The gate dielectric film 140 may include the tunneling insulating layer 142, the charge storage layer 144, and the blocking insulating layer 146, which are sequentially stacked from the channel regions 120, as shown in FIG. 4A. The tunneling insulating layer 142, the charge storage layer 144, and the blocking insulating layer 146 may be formed by, e.g., ALD, CVD, or physical vapor deposition (PVD).

Next, the second opening Tb and the side openings T1 may be filled with a conductive material 150a.

Referring to FIG. 5J, a third opening Tc may be formed by partially etching the conductive material 150a. Accordingly, the conductive material 150a may be filled only in the side openings T1 of FIG. 5H, to form the gate electrodes 150. The third opening Tc may be formed by anisotropic etching, and portions of the gate dielectric film 140 formed on top surfaces of the substrate 100 and the upper insulating layer 180 may be removed by the anisotropic etching. In an implementation, portions of the gate dielectric films 140 formed on side surfaces of the interlayer insulating layers 160 may also be removed. Next, the impurity region 105 may be formed by injecting impurities into the substrate 100 through the third opening Tc.

Referring to FIG. 5K, the insulating region 185 and the common source line 107 may be formed to fill the third opening Tc. The insulating region 185 may be formed by filling an insulating material in the third opening Tc and then performing anisotropic etching. In an implementation, the insulating region 185 may be formed of the same material as that of the interlayer insulating layers 160. Next, the common source line 107 may be formed by depositing a conductive material and etching the conductive material by using an etch-back process or the like.

Referring to FIG. 5L, a process of removing the upper insulating layer 180 and a portion of the interlayer insulating layer 169 may be performed to expose a top surface of the channel pad 170. In this process, an amount of the interlayer insulating layer 169 removed is not limited to a height illustrated in FIG. 5I, and may vary according to a removal process.

Next, an impurity injection process for the string selection transistors SST1 and SST2 of the memory cell string (see FIG. 3) formed along the channel region 120 may be performed. The impurities may include, e.g., n-type impurities such as phosphorous (P), arsenic (As), or antimony (Sb), or p-type impurities such as boron (B), aluminum (Al), gallium (Ga), or zinc (Zn). In an implementation, the impurity injection process may be omitted or may be performed in another operation.

Referring to FIG. 5M, a wiring insulating layer 187 may be formed on the interlayer insulating layer 169, the common source line 107, and the channel pad 170, and a bit line contact hole CT may be formed through the wiring insulating layer 187. The bit line contact hole CT may be formed by photolithography and etching. A bit line contact plug 190 may be formed by depositing a conductive material in the bit line contact hole CT.

In the present embodiment, due to the channel pad 170 including the spacer 176, a space for forming the bit line contact plug 190 outside the channel region 120 may be additionally secured. Accordingly, a poor connection of the bit line contact plug 190 may be reduced and/or prevented, and resistance at a connection portion may be reduced.

Referring to FIG. 5N, a bit line 195 (for connecting a plurality of the bit line contact plugs 190 arranged in the x-direction) may be formed on the wiring insulating layer 187 and the bit line contact plugs 190. The bit line 195 may be formed in a linear shape by, e.g., deposition, photolithography, and etching.

Figure 6:
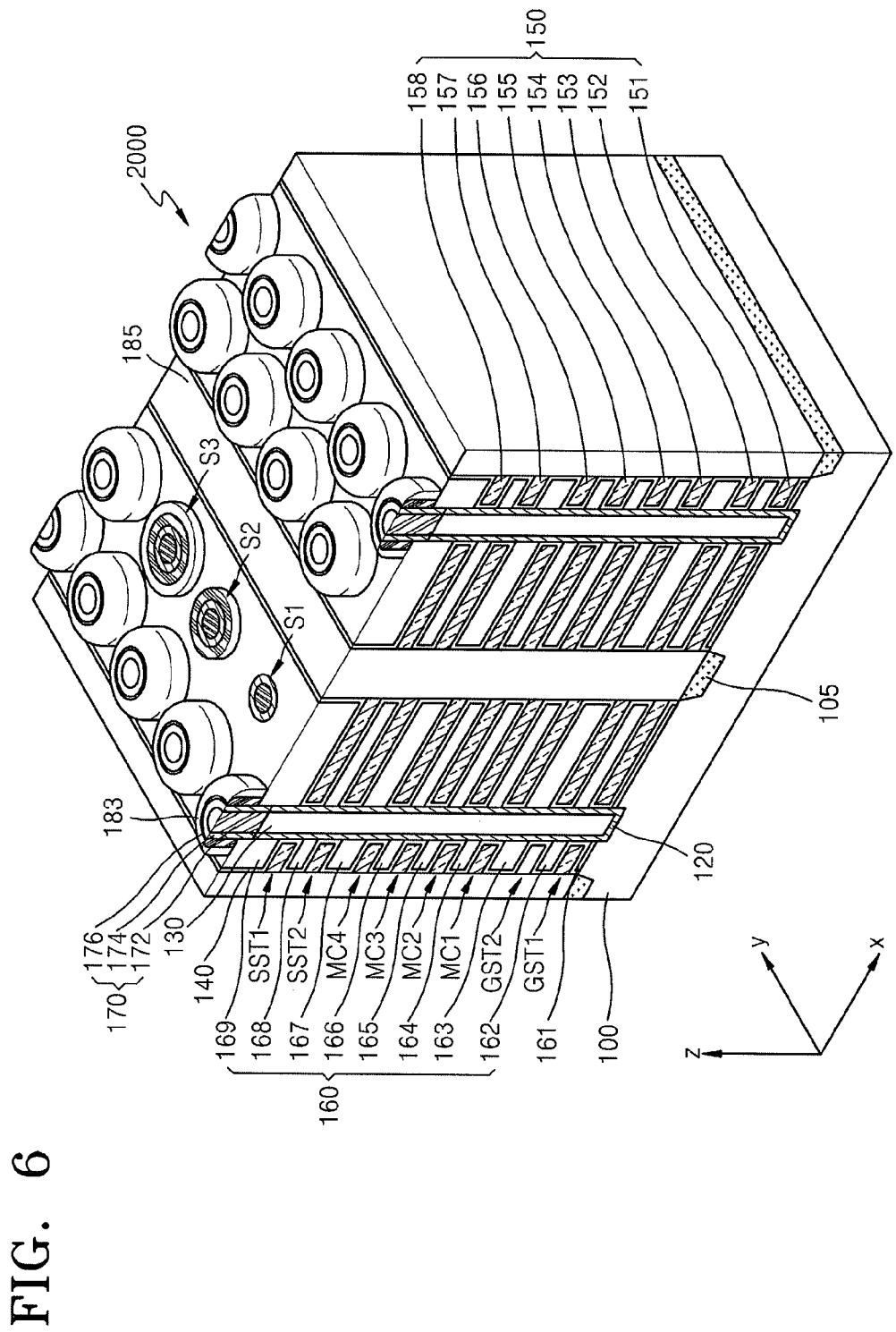
FIG. 6 illustrates a perspective view of a 3D structure of memory cell strings of a nonvolatile memory device according to another embodiment.

FIG. 6 illustrates a perspective view illustrating a 3D structure of memory cell strings of a nonvolatile memory device 2000 according to another embodiment.

In FIG. 6, some elements constituting the memory cell string 11 of FIG. 1 are not shown. For example, the bit lines BL1 through BLm of the memory cell string 11 are not shown. In FIG. 6, the same elements as those in FIG. 3 are denoted by the same reference numerals, and thus, a repeated detailed explanation thereof is omitted.

Referring to FIG. 6, the nonvolatile memory device 2000 may include the channel regions 120 disposed on the substrate 100 and a plurality of memory cell strings 11 (see FIG. 1) along side walls of the channel regions 120. In FIG. 6, the channel regions 120 are disposed at a higher density than in FIG. 3. As shown in FIG. 6, the memory cell strings 11 or 11A (see FIGS. 1 and 2) extending in the z-direction from the substrate 100 may be arranged along the side walls of the channel regions 120. Each of the memory cell strings 11 or 11A may include two ground selection transistors GST1 and GST2, a plurality of memory cells MC1, MC2, MC3, and MC4, and two string selection transistors SST1 and SST2.

The impurity regions 105 may be arranged adjacent to the main surface of the substrate 100 to extend in the y-direction and to be spaced apart in the x-direction. Unlike in FIG. 3, the common source line CSL of FIGS. 1 and 2 may be connected to the impurity regions 105 on another region (not shown). The insulating regions 185 may be formed on the impurity regions 105.

The channel pad 170 may cover a top surface of the buried insulating layer 130 and may be electrically connected to each of the channel regions 120. The channel pad 170 may include the conductive layer 172 (on the top surface of the buried insulating layer 130), the channel extending portion 174 (on the channel region 120 or formed when the channel region 120 extends around the conductive layer 172), and the spacer 176 (disposed around the channel extending portion 174). A distance between the substrate 100 and a bottom surface of the spacer 176 may be greater than a distance between the substrate 100 and a bottom surface of the conductive layer 172. The channel pad 170 may include a conductive material, e.g., polysilicon or a metal. The conductive layer 172, the channel extending portion 174, and the spacer 176 may include the same material or different materials. In an implementation, only the conductive layer 172 and the channel extending portion 174 may be formed of the same material.

A bit line contact plug (not shown) may be connected to the channel pad 170. The channel pad 170 may act as drain regions of the string selection transistors SST1 and SST2. Due to the spacer 176, an area of a region to which the bit line contact plug is connected may have a second area S2, which may be greater than a first area S1 (e.g., a sectional area of the conductive layer 172 and the channel extending portion 174).

An insulating spacer 183 may be disposed around the spacer 176 of the channel pad 170. The insulating spacer 183 may include an insulating material. The insulating material may have an etch selectivity with respect to the interlayer insulating layers 160 and the insulating region 185. For example, the insulating material may include silicon nitride. A third area S3, e.g., of the insulating spacer 183 and the channel pad 170, may be greater than the second area S2. During an etching process for forming a bit line contact plug (not shown) on the channel pad 170, an etching margin may be secured due to the insulating spacer 183, which will be explained in detail below with reference to FIGS. 7A through 7G.

In the nonvolatile memory device 2000 having a vertical structure of FIG. 6, the channel pad 170 and the insulating spacer 183 (to which the bit line contact plug for connecting the channel region 120 and a bit line is connected) may have an area greater than a sectional area, e.g., an area encompassed by, the channel region 120. Accordingly, although the size of the channel region 120 may decrease as the nonvolatile memory device 2000 is minimized, the bit line contact plug may be stably formed.

FIGS. 7A through 7G illustrate cross-sectional views of stages in a method of manufacturing the nonvolatile memory device 2000 of FIG. 6, when seen in the y-direction.

In FIGS. 7A through 7G, the same elements as those in FIGS. 5A through 5N are denoted by the same reference numerals, and thus, a repeated detailed explanation thereof is omitted.

Figure 7A:
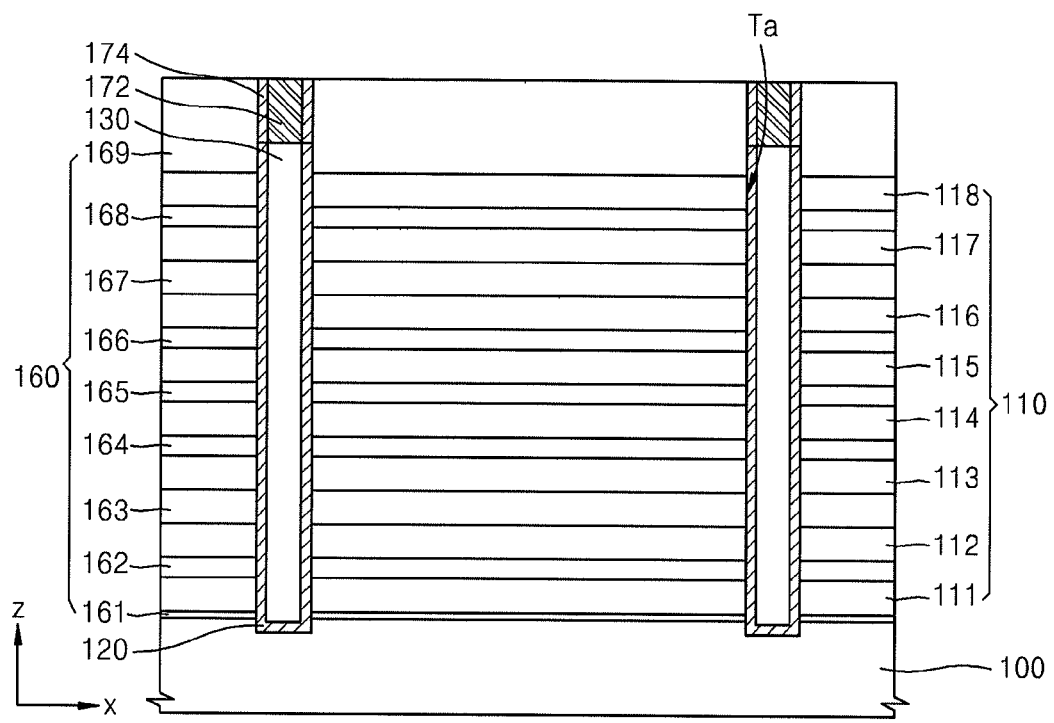
FIGS. 7A through 7G illustrate cross-sectional views of stages in a method of manufacturing the nonvolatile memory device of FIG. 6.

Referring to FIG. 7A, the same processes as described with reference to FIGS. 5A through 5D may be sequentially performed.

The interlayer sacrificial layers 111 through 118 (which are collectively referred to as the interlayer sacrificial layers 110) and the plurality of interlayer insulating layers 161 through 169 (which are collectively referred to as the interlayer insulating layers 160) may be alternately stacked on the substrate 100. The interlayer sacrificial layers 110 may be formed of a material having an etch selectivity with respect to the interlayer insulating layers 160.

Next, first openings Ta may be formed through the alternately stacked interlayer insulating layers 160 and interlayer sacrificial layers 110. The first openings Ta may be holes having a depth in the z-direction. Next, the channel regions 120 may be formed to uniformly cover inner walls and bottom surfaces of the first openings Ta, and the buried insulating layer 130 may be filled in each of the first openings Ta. The buried insulating layer 130 may be filled not to reach a top surface of the interlayer insulating layer 169, but rather to reach to a predetermined height of the interlayer insulating layer 169.

Next, a material used to form the conductive layer 172 may be deposited on the buried insulating layer 130. After the deposition, portions of a material of the channel region 120 and a material of the conductive layer 172 (which portions are unnecessary and cover the interlayer insulating layer 169) may be removed by performing a planarization process. Accordingly, the conductive layer 172 may be formed on the buried insulating layer 130. For convenience of explanation, a structure or material on the channel region or a portion of the channel region 120 disposed around the conductive layer 172 may be referred to as the channel extending portion 174. For example, the channel extending portion 174 may extend from a top of the channel region 120. In an implementation, the channel region 120 and the channel extending portion 174 may be formed of the same material. However, in another implementation, the channel extending portion 174 may include a material different from that of the channel region 120.

Figure 7B:
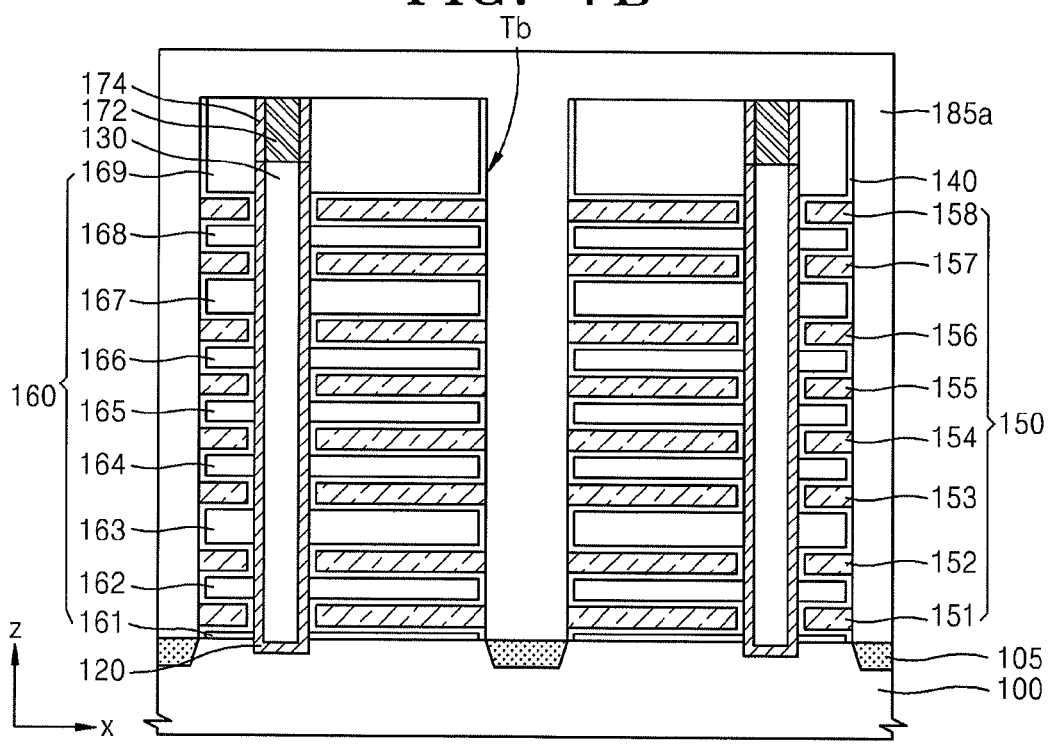

Referring to FIG. 7B, similar processes as those described with reference to FIGS. 5H through 5J may be sequentially performed.

The second opening Tb (through which the substrate 100 is exposed) may be formed. The interlayer sacrificial layers 110 (exposed through the second opening Tb) may be removed by etching, and thus, the plurality of side openings T1 (see FIG. 5H) defined between the interlayer insulating layers 160 may be formed.

Next, the gate dielectric film 140 may be formed to uniformly cover the channel regions 120, the interlayer insulating layers 160, and the substrate 100 exposed through the second opening Tb and the side openings T1. The gate dielectric film 140 may include the tunneling insulating layer 142, the charge storage layer 144, and the blocking insulating layer 146, which may be sequentially stacked from the channel regions 120, as shown in FIG. 4A.

Next, the gate electrodes 150 may be formed in the second opening Tb and the side openings T1. The gate electrodes 150 may be formed by depositing a conductive material (not shown), forming a third opening (not shown) at a same position as that of the second openings Tb, and partially removing the conductive material. Next, the impurity regions 105 may be formed by injecting impurities into the substrate 100 through the third opening (not shown).

Next, an insulating material 185a filled in the third opening Tc may be formed. The insulating material 185a may be a same material as that of the interlayer insulating layers 160. The insulating material 185a may be formed to be filled in the third opening Tc and to cover the interlayer insulating layer 169, the conductive layer 172, and the channel extending portion 174.

Figure 7C:
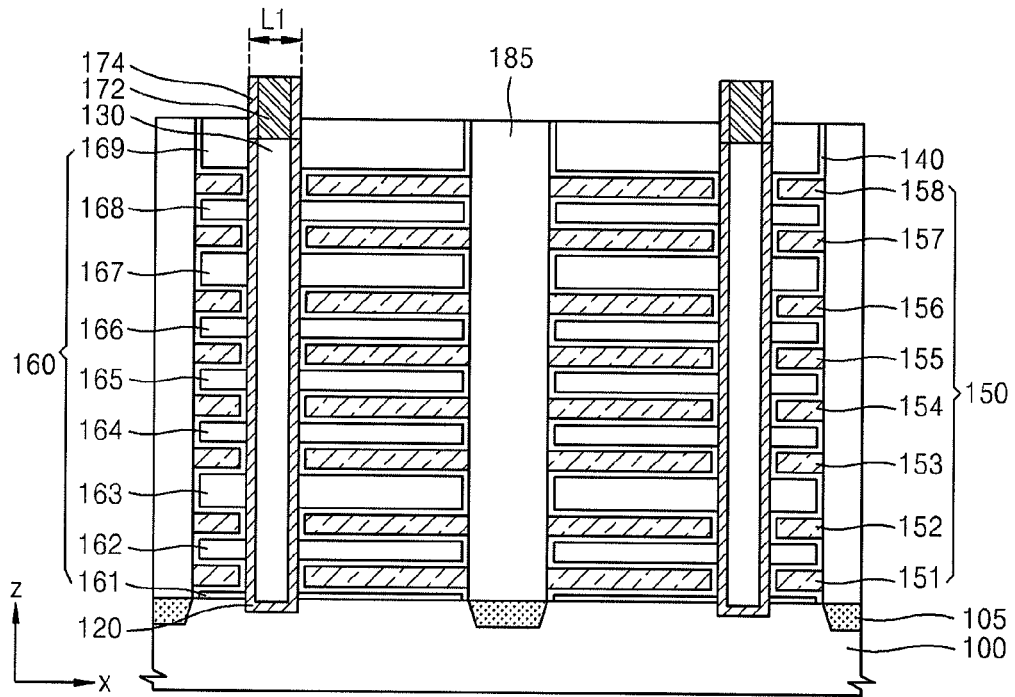

Referring to FIG. 7C, a process for removing a portion of the insulating material 185a and a portion of the interlayer insulating layer 169 such that the conductive layer 172 and the channel extending portion 174 protrude over the interlayer insulating layer 169 may be performed. In a cross-sectional view taken along a center, the conductive layer 172 and the channel extending portion 174 may have a first length L1 in a lateral direction. For example, the first length L1 may correspond to a diameter of a circle including the conductive layer 172 at its center and surrounded by the channel extending portion 174. Due to this process, the insulating regions 185 may be formed on the impurity regions 105. In this process, an amount or degree of the interlayer insulating layer 169 removed may not be limited to a height illustrated in FIG. 7C, and may vary according to a removal process.

Next, an impurity injection process for channels of the string selection transistors SST1 and SST2 (see FIG. 3) of the memory cell strings formed along the channel regions 120 may be performed. In an implementation, the impurity injection process may be omitted or may be performed in another operation.

Figure 7D:
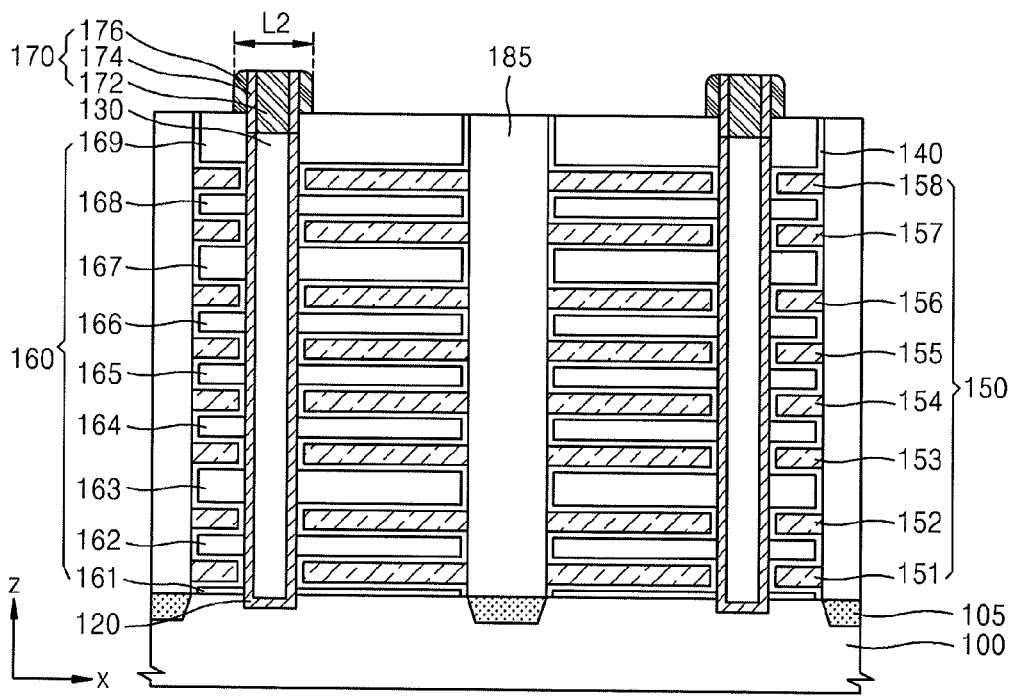

Referring to FIG. 7D, similar processes as those described with reference to FIGS. 5F and 5G may be sequentially performed.

The spacer 176 may be formed on the conductive layer 172, the channel extending portion 174, and the interlayer insulating layer 169. The spacer 176 may be formed by depositing a conductive material (not shown), and partially removing the conductive material by, e.g., anisotropic etching. The spacer 176 may include the same material as that of the conductive layer 172 and/or the channel extending portion 174.

The spacer 176 may be formed to surround an upper portion of the channel extending portion 174. Thus, the channel pad 170 (including the conductive layer 172, the channel extending portion 174, and the spacer 176) may be completely formed. The channel pad 170 may have a second length L2 in a lateral direction. The second length L2 may correspond to a diameter of a circle including the conductive layer 172 and the channel extending portion 174 at its center and surrounded by the spacer 176. The second length L2 may be greater than the first length L1 described with reference to FIG. 7C, and thus, a landing margin of a bit line contact plug (to be formed in a subsequent process) may be secured.

According to the method of manufacturing the nonvolatile memory device 2000, the spacer 176 may be formed after the gate electrodes 150 are formed, unlike in the method described with reference to FIGS. 5A through 5N.

Figure 7E:
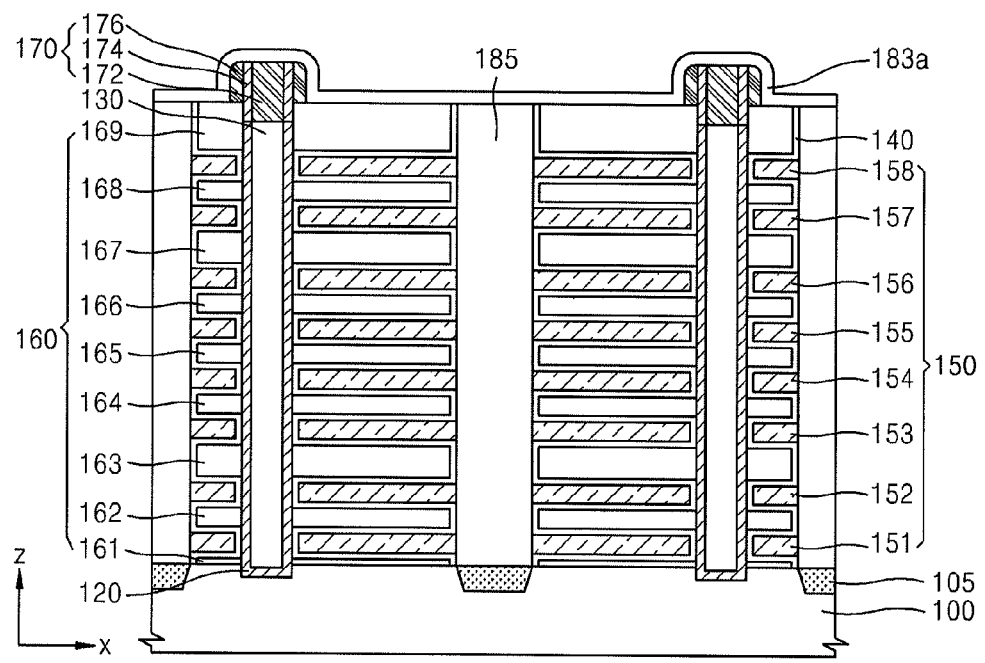

Referring to FIG. 7E, an insulating material 183a may be deposited on the interlayer insulating layer 169, the channel pad 170, and the insulating region 185. The insulating material 183a may be a material that has an etch selectivity with respect to the interlayer insulating layer 169 and the insulating region 185. In an implementation, the insulating material 183a may include, e.g., silicon nitride or silicon carbide.

Figure 7F:
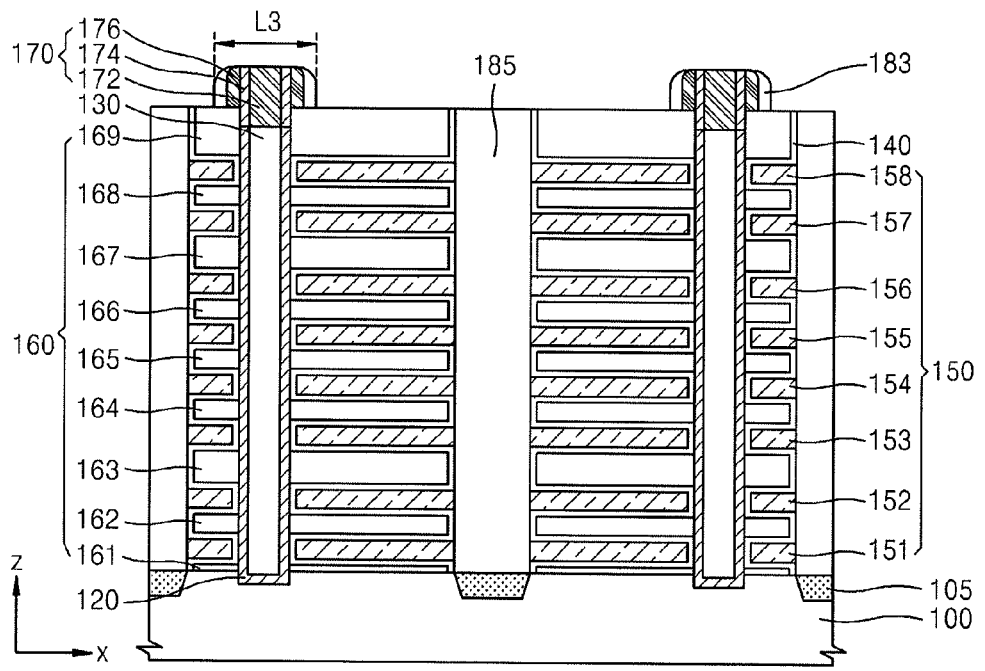

Referring to FIG. 7F, the insulating spacer 183 may be formed around the spacer 176 by partially removing the insulating material 183a. A difference between heights of the insulating spacer 183 and the spacer 176 is not limited to a height illustrated in FIG. 7F, and may vary in various ways. A lateral length of the insulating spacer 183 including the channel pad 170 at its center may be a third length L3. The third length L3 may be greater than the second length L2 described with reference to FIG. 7D, and thus, a process margin of a bit line contact (to be formed in a subsequent process) may be secured. For example, a bit line contact may be prevented from being downwardly longitudinally formed along side surface of the channel region 120 due to misalignment.

Figure 7G:
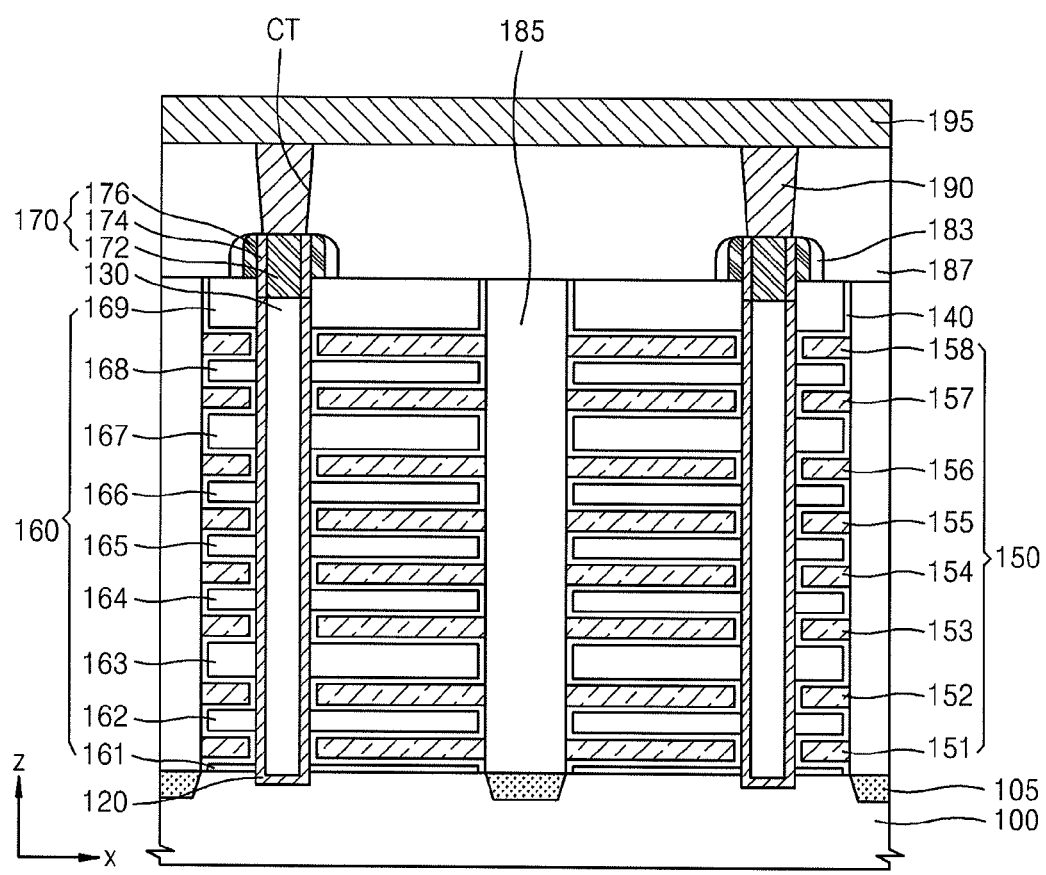

Referring to FIG. 7G, the wiring insulating layer 187 may be formed on the interlayer insulating layer 169 and the channel pad 170, and the bit line contact plug 190 may be formed through the wiring insulating layer 187. The bit line contact plug 190 may be formed by forming a bit line contact hole CT by photolithography and etching, and depositing a conductive material.

The wiring insulating layer 187 may include the same material as that of the interlayer insulating layer 169. Also, the wiring insulating layer 187 may include a material that has an etch selectivity with respect to the insulating spacer 183. Accordingly, when an etching process for forming the bit line contact hole CT is performed, even when the bit line contact hole CT is formed by a predetermined width outside the spacer 176, the bit line contact hole CT may be prevented from being formed by etching due to the insulating spacer 183.

Next, the bit line 195 (for connecting a plurality of the bit line contact plugs 190 arranged in the x-direction) may be formed on the wiring insulating layer 187 and the bit line contact plugs 190. The bit line 195 may be formed in a linear shape by photolithography and etching.

Figure 8:
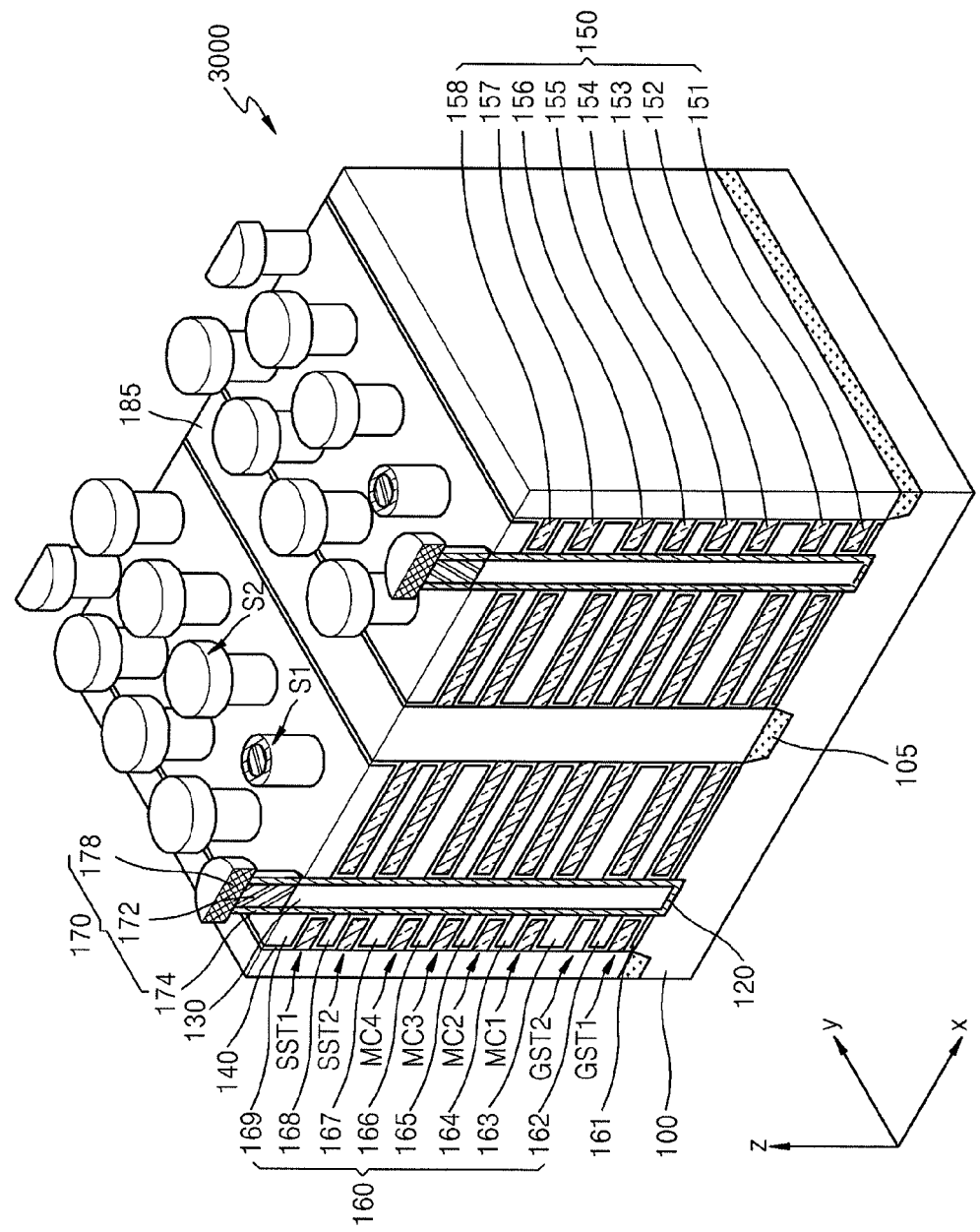
FIG. 8 illustrates a perspective view of a 3D structure of memory cell strings of a nonvolatile memory device according to yet another embodiment.

FIG. 8 illustrates a perspective view of a 3D structure of memory cell strings of a nonvolatile memory device 3000 according to yet another embodiment.

In FIG. 8, some elements constituting the memory cell string 11 of FIG. 1 may not be shown. For example, the bit lines BL1 through BLm of the memory cell string 11 are not shown. In FIG. 8, the same elements as those in FIGS. 3 and 6 are denoted by the same reference numerals, and thus, a repeated detailed explanation thereof is omitted.

Referring to FIG. 8, the nonvolatile memory device 3000 may include channel regions 120 disposed on the substrate 100, and a plurality of memory cell strings disposed on side walls of the channel regions 120. As shown in FIG. 8, the memory cell strings 11 or 11A (see FIGS. 1 and 2) extending in the z-direction from the substrate 100 may be arranged along the side walls of the channel regions 120. Each of the memory cell strings 11 or 11A may include two ground selection transistors GST1 and GST2, a plurality of memory cells MC1, MC2, MC3, and MC4, and two string selection transistors SST1 and SST2.

The channel pad 170 may be formed to cover a top surface of the buried insulating layer 130 and to be electrically connected to respective ones of the channel regions 120. The channel pad 170 may include the conductive layer 172 (disposed on the top surface of the buried insulating layer 130), the channel extending portion 174 (e.g., a structure or material on the channel region 120 or formed when the channel region 120 extends around the conductive layer 172), and a cover portion 178 (disposed on top surfaces of the conductive layer 172 and the channel extending portion 174, e.g., overlying the conductive layer 172 and the channel extending portion 174). A height of the conductive layer 172 may not be limited to a height illustrated in FIG. 8, and may vary on a side surface of the interlayer insulating layer 169. A bit line contact plug (not shown) may be connected to the channel pad 170, and the channel pad 170 may act as drain regions of the string selection transistors SST1 and SST2. Due to the cover portion 178, an area of a region to which the bit line contact plug is connected may be represented by a second area S2, which may be greater than a first area S1 (e.g., a sectional area of the channel extending portion 174 together with the conductive layer 172).

The channel pad 170 may include a conductive material, e.g., polysilicon or a metal. The conductive layer 172, the channel extending portion 174, and the cover portion 178 may include the same material or different materials. In an implementation, only the conductive layer 172 and the channel region 174 may be formed of the same material.

In the nonvolatile memory device 3000 having a vertical structure of FIG. 8, the channel pad 170 (to which the bit line contact plug for connecting the channel region 120 and a bit line is connected) may be formed to have an area greater than that of each of the channel regions 120. Accordingly, although a size of the channel region 120 may decrease as the nonvolatile memory device 3000 is minimized, the bit line contact plug may be stably formed.

Figure 9A:
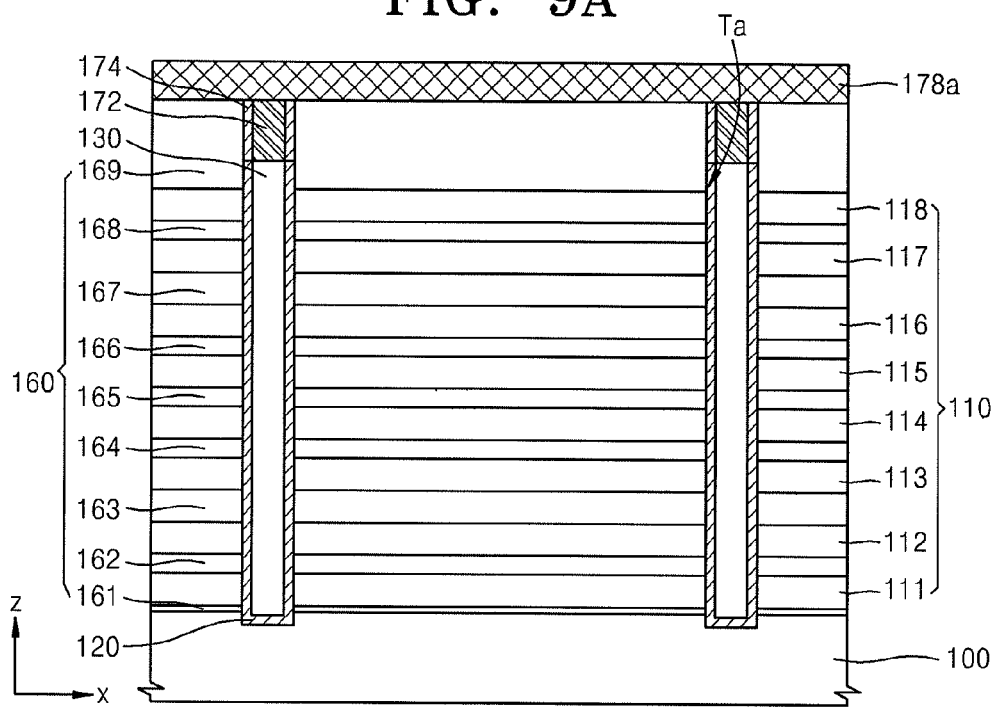
FIGS. 9A through 9C illustrate cross-sectional views of stages in a method of manufacturing the nonvolatile memory device of FIG. 8.
Figure 9B:
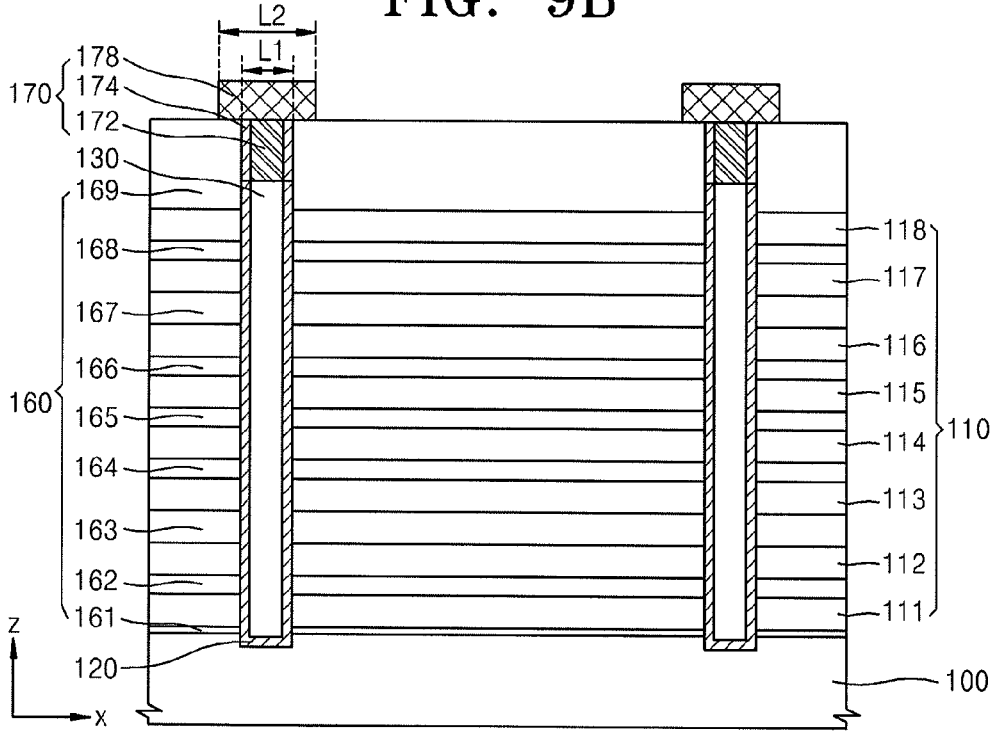
Figure 9C:
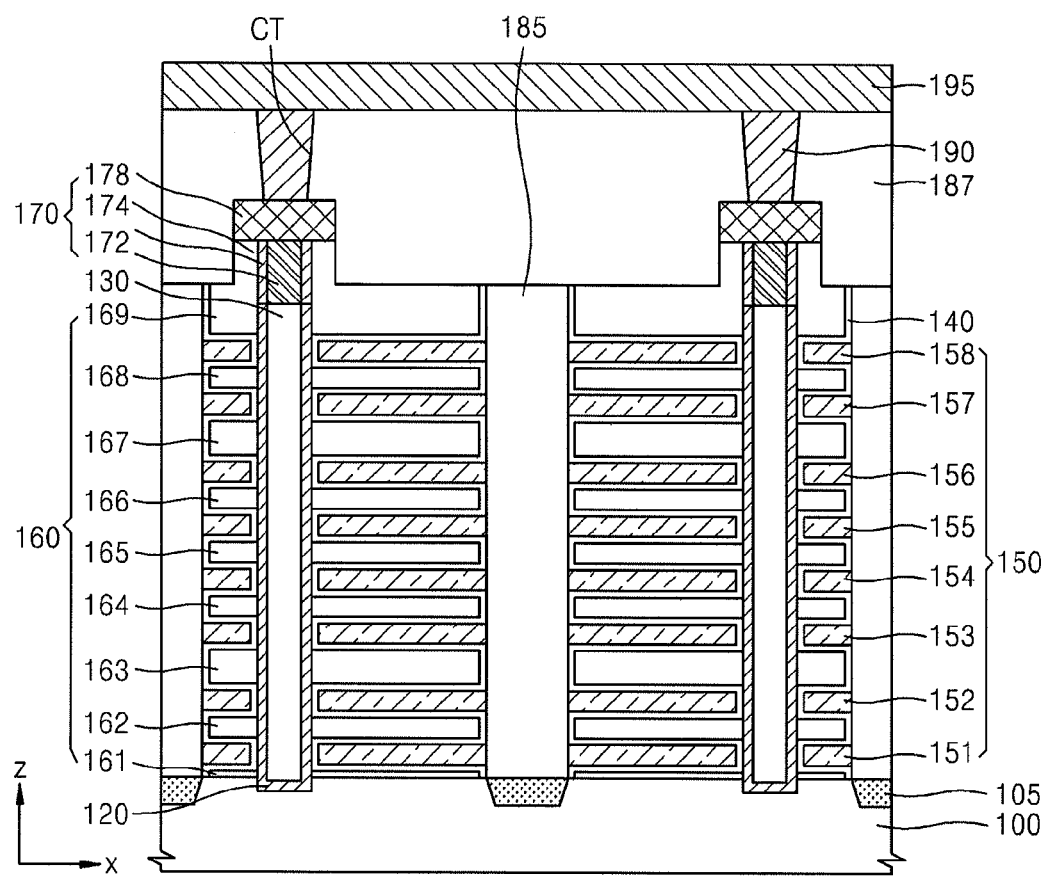

FIGS. 9A through 9C illustrate cross-sectional views showing stages in a method of manufacturing the nonvolatile memory device 3000 of FIG. 8, when seen in the y-direction.

Referring to FIG. 9A, the same processes as those described with reference to FIGS. 5A through 5D may be sequentially performed, and thus, a repeated detailed description thereof is omitted.

The plurality of interlayer sacrificial layers 111 through 118 (which are collectively referred to as the interlayer sacrificial layers 110) and the plurality of interlayer insulating layers 161 through 169 (which are collectively referred to as the interlayer insulating layers 160) may be alternately stacked on the substrate 100. The channel region 120 and the buried insulating layer 130 may be formed in each of the first openings Ta.

Next, the conductive layer 172 may be formed on the buried insulating layer 130. For convenience of explanation, a structure or material on the channel region or a portion of the channel region 120 disposed around the conductive layer 172 may be referred to as the channel extending portion 174. In an implementation, the conductive layer 172 and the channel extending portion 174 may be integrally formed.

Next, a conductive material 178a may be deposited on the interlayer insulating layer 169, the conductive layer 172, and the channel extending portion 174. The conductive material 187a may be the same material as that of the channel region 120 and the channel extending portion 174. In an implementation, the conductive material 178a may be different from that of the channel extending portion 174 and the channel region 120.

Referring to FIG. 9B, a process of patterning the conductive material 178a may be performed. The patterning process may include patterning a photoresist layer (not shown) on the conductive material 178a by lithography and etching an exposed portion of the conductive material 178a. Accordingly, the cover portion 178 (which covers top surfaces of the conductive layer 172 and the channel extending portion 174) may be formed, and the channel pad 170, (including the conductive layer 172, the channel extending portion 174, and the cover portion 178) may be formed. The cover portion 178 may have, e.g., a cylindrical shape or a polygonal pillar shape.

In a cross-sectional view taken along a center, the conductive layer 172 and the channel extending portion 174 may have a first length L1 in a lateral direction. For example, the first length L1 may correspond to a diameter of a circle including the conductive layer 172 at its center and surrounded by the channel extending portion 174. In a cross-sectional view taken along the center of the cover portion 178, the cover portion 178 may have a second length L2, and the second length L2 may be greater than the first length L1. In an implementation, a bent portion may be formed outside the channel extending portion 174 at a portion to which the channel extending portion 174 and the cover portion 178 are connected.

Referring to FIG. 9C, similar processes as those described with reference to FIGS. 5H through 5N may be sequentially performed, and thus, a repeated detailed explanation thereof is omitted.

After the gate electrodes 150 are formed, the wiring insulating layer 187 may be formed on the interlayer insulating layer 169 and the channel pad 170. Next, the bit line contact plug 190 may be formed on the cover portion 178 through the wiring insulating layer 187.

According to the present embodiment, the channel pad 170 may include the cover portion 178. Thus, a space for forming the bit line contact plug 190 outside the channel region 120 may be additionally secured. Accordingly, poor connection of the bit line contact plug 190 may be reduced and/or prevented, and resistance at a connection portion may be reduced.

Next, the bit line 195 for connecting the bit line contact plugs 190 arranged in the x-direction may be formed on the wiring insulating layer 187 and the bit line contact plugs 190. The bit line 195 may be formed in a linear shape by photolithography and etching.

Figure 10:
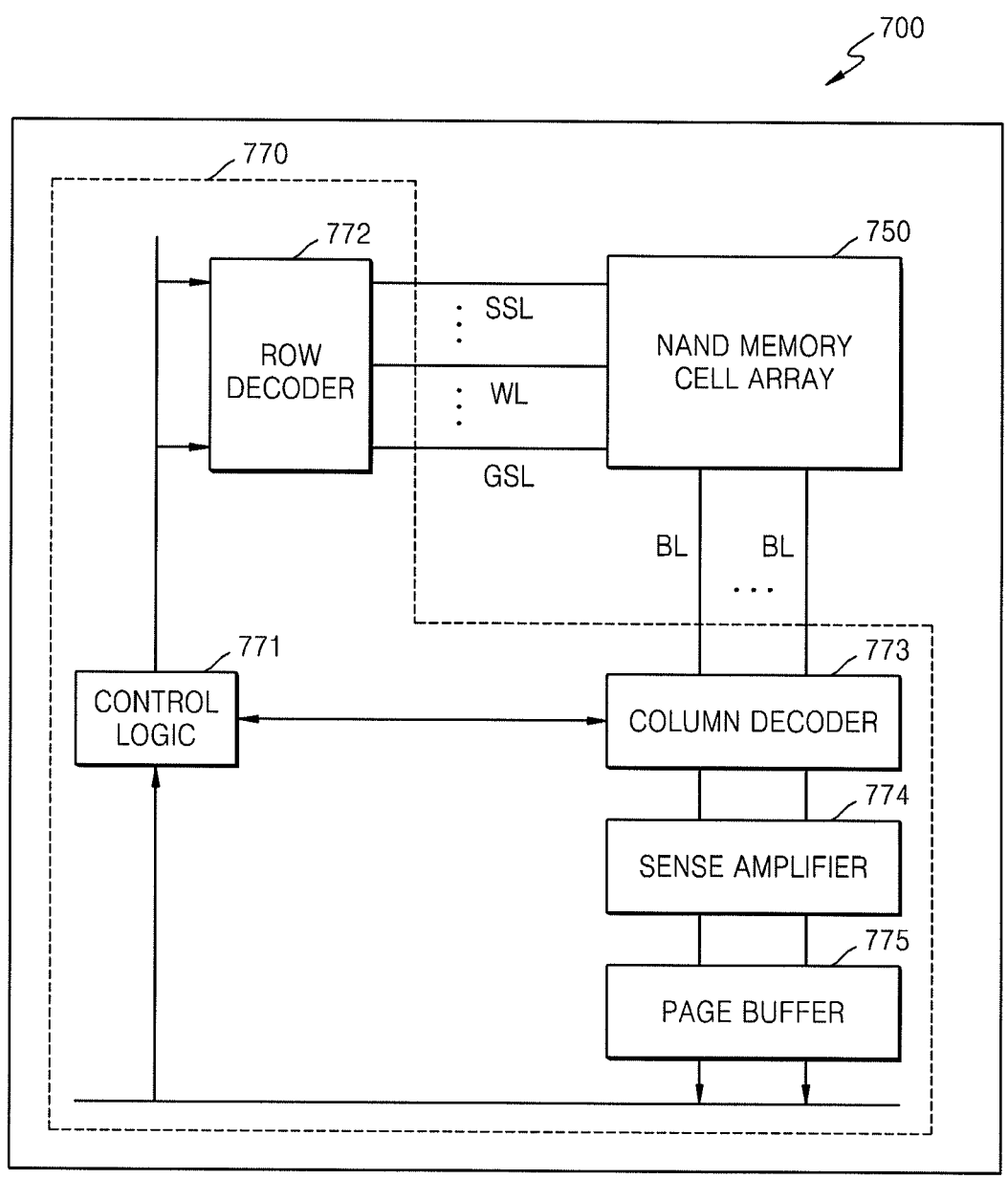
FIG. 10 illustrates a block diagram of a nonvolatile memory device according to an embodiment.

FIG. 10 illustrates a block diagram of a nonvolatile memory device 700 according to an embodiment.

Referring to FIG. 10, in the nonvolatile memory device 700, a NAND memory cell array 750 may be connected to a core circuit unit 770. For example, the NAND memory cell array 750 may include any one of the nonvolatile memory devices 1000, 2000, and 3000 of FIGS. 3, 6, and 8. The core circuit unit 770 may include, e.g., a control logic 771, a row decoder 772, a column decoder 773, a sense amplifier 774, and a page buffer 775.

The control logic 771 may communicate with the row decoder 772, the column decoder 773, and the page buffer 775. The row decoder 772 may communicate with the NAND memory cell array 750 via a plurality of string selection lines SSL, a plurality of word lines WL, and a plurality of ground selection lines GSL. The column decoder 773 may communicate with the NAND memory cell array 750 via a plurality of bit lines BL. The sense amplifier 774 may be connected to the column decoder 773 when a signal is output from the NAND memory cell array 750, and may not be connected to the column decoder 773 when a signal is transmitted to the NAND memory cell array 750.

For example, the control logic 771 may transmit a row address signal to the row decoder 772, and the row decoder 772 may decode the row address signal and transmit the same to the NAND memory cell array 750 via the string selection lines SSL, the word lines WL, and the ground selection lines GSL. The control logic 771 may transmit a column address signal to the column decoder 773 or the page buffer 775, and the column decoder 773 may decode the column address signal and transmit the same to the NAND memory cell array 750 via the plurality of bit lines BL. A signal of the NAND memory cell array 750 may be transmitted to the sense amplifier 774 via the column decoder 773, may be amplified by the sense amplifier 774, and then may be transmitted to the control logic 771 through the page buffer 775.

By way of summation and review, a nonvolatile memory device having a vertical structure may include a bit line contact plug for connecting a bit line and a channel region. In one type of nonvolatile memory device having a vertical structure, a channel pad having the same size as that of a channel region may be formed on the channel region having a vertical hole shape in order to be connected to a bit line contact plug.

However, as semiconductor devices are more highly integrated and sizes of channel regions are minimized, a margin of a bit line contact plug may decrease. Also, if a bit line contact plug is formed at a side surface of a channel region along the channel region, a contact area may not be constant due to misalignments.

The embodiments provide a nonvolatile memory device having a vertical structure with high integration density and high reliability, e.g., reliable connections having a constant contact area between a bit line contact plug and a channel region, thereby avoiding poor RC distribution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device having a vertical structure, the nonvolatile memory device comprising:
    a channel region that vertically extends from a substrate;
    gate electrodes on the substrate, the gate electrodes being disposed along an outer side wall of the channel region and spaced apart from one another; and
    a channel pad that extends from one side of the channel region to an outside of the channel region, the channel pad covering a top surface of the channel region,
    wherein the channel pad includes:
    a channel extending portion vertically extending on the channel region, and
    a spacer on an outer circumferential surface of the channel extending portion.

2. The nonvolatile memory device as claimed in claim 1, wherein the spacer forms a bent portion at a boundary with an outer side wall of the channel extending portion or the channel region.

3. The nonvolatile memory device as claimed in claim 1, wherein an area of a top surface of the channel pad is greater than an area of the top surface of the channel region.

4. The nonvolatile memory device as claimed in claim 1, further comprising a bit line contact plug on the channel pad, the bit line contact plug being connected to a bit line.

5. The nonvolatile memory device as claimed in claim 1, further comprising an insulating spacer on a side surface of the channel pad.

6. The nonvolatile memory device as claimed in claim 1, wherein the channel pad includes:
    a cover portion on the channel extending portion, the cover portion having an area greater than an area of the channel extending portion.

7. The nonvolatile memory device as claimed in claim 1, further comprising a buried insulating layer at a center of the channel region, wherein the channel pad further includes a conductive layer on a top surface of the buried insulating layer, the conductive layer filling in the channel extending portion.

8. The nonvolatile memory device as claimed in claim 7, wherein a distance between the substrate and a bottom surface of the conductive layer is less than a distance between the substrate and a bottom surface of the spacer.

9. A nonvolatile memory device having a vertical structure, the nonvolatile memory device comprising:
    a channel region that vertically extends from a substrate;
    gate electrodes on the substrate, the gate electrodes being disposed along an outer side wall of the channel region and spaced apart from one another; and
    a conductive channel pad on and electrically connected to the channel region,
    wherein:
        the channel pad covers a top surface of the channel region,
        an area of a top surface of the channel pad is greater than an area of a top surface of the channel region, and
        the channel pad includes a conductive channel extending portion overlying the channel region, a conductive layer encompassed by the channel extending portion, and a conductive spacer on an outer circumferential surface of the channel extending portion.

10. The nonvolatile memory device as claimed in claim 9, further comprising an insulating spacer on an outer circumferential surface of the channel pad.

11. The nonvolatile memory device as claimed in claim 9, wherein the channel pad further includes a conductive cover portion overlying the channel extending portion and the conductive layer, an area of a top surface of the cover portion being greater than an area of top surfaces of the channel extending portion and the conductive layer.

12. The nonvolatile memory device as claimed in claim 9, further comprising a bit line contact plug on and electrically connected to the channel pad, the bit line contact plug being electrically connected to a bit line.

* * * * *